United States Patent
Vemuri et al.

(10) Patent No.: US 10,789,402 B1
(45) Date of Patent: Sep. 29, 2020

(54) COMPILER AND HARDWARE ABSTRACTION LAYER ARCHITECTURE FOR A NEURAL NETWORK ACCELERATOR

(71) Applicant: Xilinx, Inc., San Jose, CA (US)

(72) Inventors: Kumar S. S. Vemuri, Hyderabad (IN); Abid Karumannil, Malappuram (IN); Venkataraju Koppada, Hyderabad (IN); Anitha Barri, Hyderabad (IN); Anusha Perla, Hyderabad (IN); Vishal K. Jain, Chhindwara (IN); Sairam K. M. Menon, Hyderabad (IN); Anil K. Martha, Warangal (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/400,690

(22) Filed: May 1, 2019

(51) Int. Cl.
*G06F 30/327* (2020.01)
*G06N 3/04* (2006.01)
*G06N 3/063* (2006.01)
*G06N 3/08* (2006.01)

(52) U.S. Cl.
CPC ............ *G06F 30/327* (2020.01); *G06N 3/04* (2013.01); *G06N 3/063* (2013.01); *G06N 3/082* (2013.01); *G06F 2207/4824* (2013.01)

(58) Field of Classification Search
CPC .................. G06F 30/327; G06F 30/20; G06F 2207/4824; G06N 3/08; G06N 3/063; G06N 3/084; G06N 3/04; G06N 3/02; G06N 3/0454; G06N 3/0445; G06N 20/00; G06N 3/082
See application file for complete search history.

(56) References Cited

U.S. PATENT DOCUMENTS

| | | | |
|---|---|---|---|
| 9,117,176 B2 * | 8/2015 | Szatmary ................. | G06N 3/08 |
| 10,467,501 B2 * | 11/2019 | N .......................... | G06K 9/6218 |
| 2018/0039886 A1 | 2/2018 | Umuroglu et al. | |
| 2018/0203956 A1 | 7/2018 | Ng et al. | |
| 2019/0057305 A1 | 2/2019 | Denolf et al. | |
| 2019/0114535 A1 * | 4/2019 | Ng ......................... | G06N 3/063 |
| 2019/0122111 A1 * | 4/2019 | Min ...................... | G06N 3/0454 |
| 2019/0244091 A1 * | 8/2019 | Weber ...................... | G06N 3/04 |
| 2019/0286972 A1 * | 9/2019 | El Husseini ............ | G06F 8/451 |
| 2019/0286973 A1 * | 9/2019 | Kovvuri e ................. | G06N 3/04 |
| 2019/0303762 A1 * | 10/2019 | Sui ........................... | G06N 3/063 |

(Continued)

OTHER PUBLICATIONS

Girau; "On-chip learning of FPGA-inspired neural nets"; International Joint Conference on Neural Networks. Proceedings; vol. 1; Conference Paper; Publisher: IEEE (Year: 2001).*

(Continued)

*Primary Examiner* — Helen Rossoshek
(74) *Attorney, Agent, or Firm* — Patterson+Sheridan, LLP

(57) ABSTRACT

Examples herein describe a method for a compiler and hardware-abstraction-layer architecture for a programmable integrated circuit (IC). In one embodiment, a method for mapping and porting a neural network to an integrated circuit (IC) is disclosed. The method includes receiving a network description of the neural network; generating a framework independent network graph based on the network description; performing a plurality of back-end operations on the network graph to generate an execution sequence vector; and configuring the IC based on the execution sequence vector.

20 Claims, 25 Drawing Sheets

(56) References Cited

U.S. PATENT DOCUMENTS

2019/0324759 A1* 10/2019 Yang .................. G06F 15/80
2019/0340492 A1* 11/2019 Burger ............... G06F 9/30025
2019/0340499 A1* 11/2019 Burger ............... G06N 3/0454
2020/0104715 A1* 4/2020 Denolf ................ G06N 3/082
2020/0151088 A1* 5/2020 Gu ..................... G06N 7/005

OTHER PUBLICATIONS

Hu et al.; "BitFlow: Exploiting Vector Parallelism for Binary Neural Networks on CPU"; 2018 IEEE International Parallel and Distributed Processing Symposium (IPDPS); Conference Paper; Publisher: IEEE (Year: 2018).*

Loni et al.; "ADONN: Adaptive Design of Optimized Deep Neural Networks for Embedded Systems"; 2018 21st Euromicro Conference on Digital System Design (DSD); Conference Paper; Publisher: IEEE (Year: 2018).*

Zhang et al.; "Caffeine: Towards uniformed representation and acceleration for deep convolutional neural networks"; 2016 IEEE/ACM International Conference on Computer-Aided Design (ICCAD); Conference Paper; Publisher: IEEE (Year: 2016).*

Sharma et al.; "From high-level deep neural models to FPGAs"; 2016 49th Annual IEEE/ACM International Symposium on Microarchitecture (Micro); Conference Paper; Publisher: IEEE (Year: 2016).*

* cited by examiner

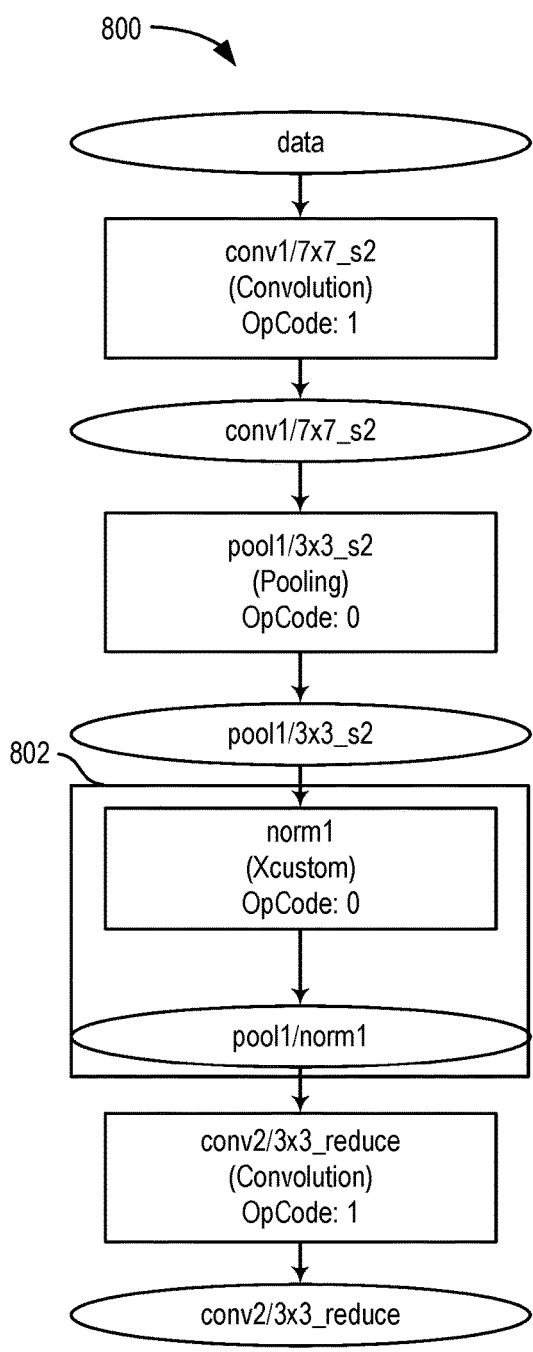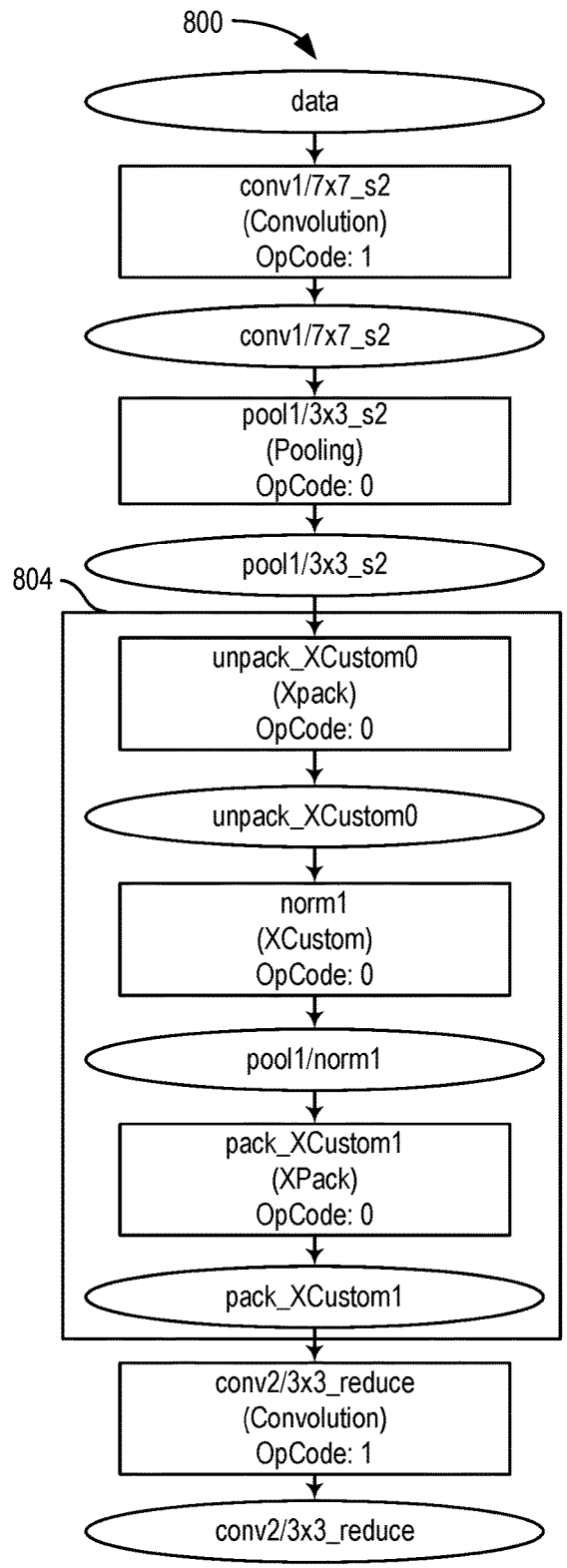
FIG. 8A
FIG. 8B

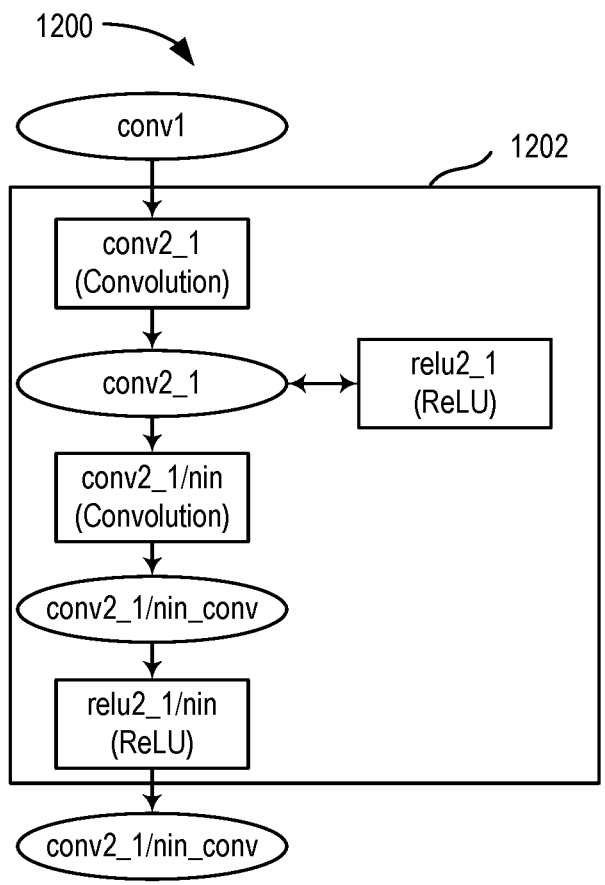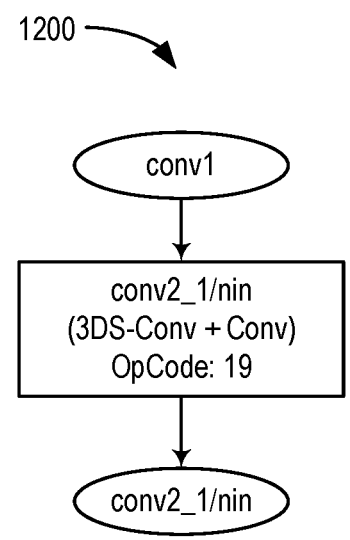
FIG. 12A
FIG. 12B

COMPILER AND HARDWARE ABSTRACTION LAYER ARCHITECTURE FOR A NEURAL NETWORK ACCELERATOR

TECHNICAL FIELD

Examples of the present disclosure generally relate to software architecture for a neural network accelerator.

BACKGROUND

Neural networks are currently widely used for many artificial intelligence applications including computer vision, speech recognition, robotics, etc. A deep neural network (DNN) based system design consists of two phases: training and inference. The training phase (also known as the learning phase) involves determining the values of the weights of the network layers. Once trained, the DNN can perform its task by computing the outputs using the weights generated in the training phase. The inference phase involves computing the outputs to perform a specific task. While DNN based systems can deliver state-of-the-art accuracies on many tasks, they are computationally complex. There are many different kinds of layers: convolution, max pooling, fully connected, Rectified Linear Unit (ReLU), batch norm, etc. These different layers are used in designing these deep-learning based inference models. Integrated circuits (ICs), such as Field Programmable Gate Arrays (FPGAs), can accelerate the performance of these compute-intensive layers.

Because of the intensity of the computation needed for a convolution layer of a neural network, a typical processing unit (e.g., a general purpose central programming unit (CPU)) is often a poor choice for executing neural networks, especially in terms of getting the right amount of latency and memory usage.

SUMMARY

A method for mapping and porting a neural network to an integrated circuit (IC) is disclosed. In one embodiment, the method includes receiving a network description of the neural network; generating a framework independent network graph based on the network description; performing a plurality of back-end operations on the network graph to generate an execution sequence vector; and configuring the IC based on the execution sequence vector.

Aspects of the present disclosure also provide apparatus, methods, processing systems, and computer readable mediums for performing the operations described above.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIGS. 8A-B depict an example optimization of a network graph, according to embodiments of the present disclosure.

FIGS. 12A-B depict an example optimization of a network graph, according to embodiments of the present disclosure.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
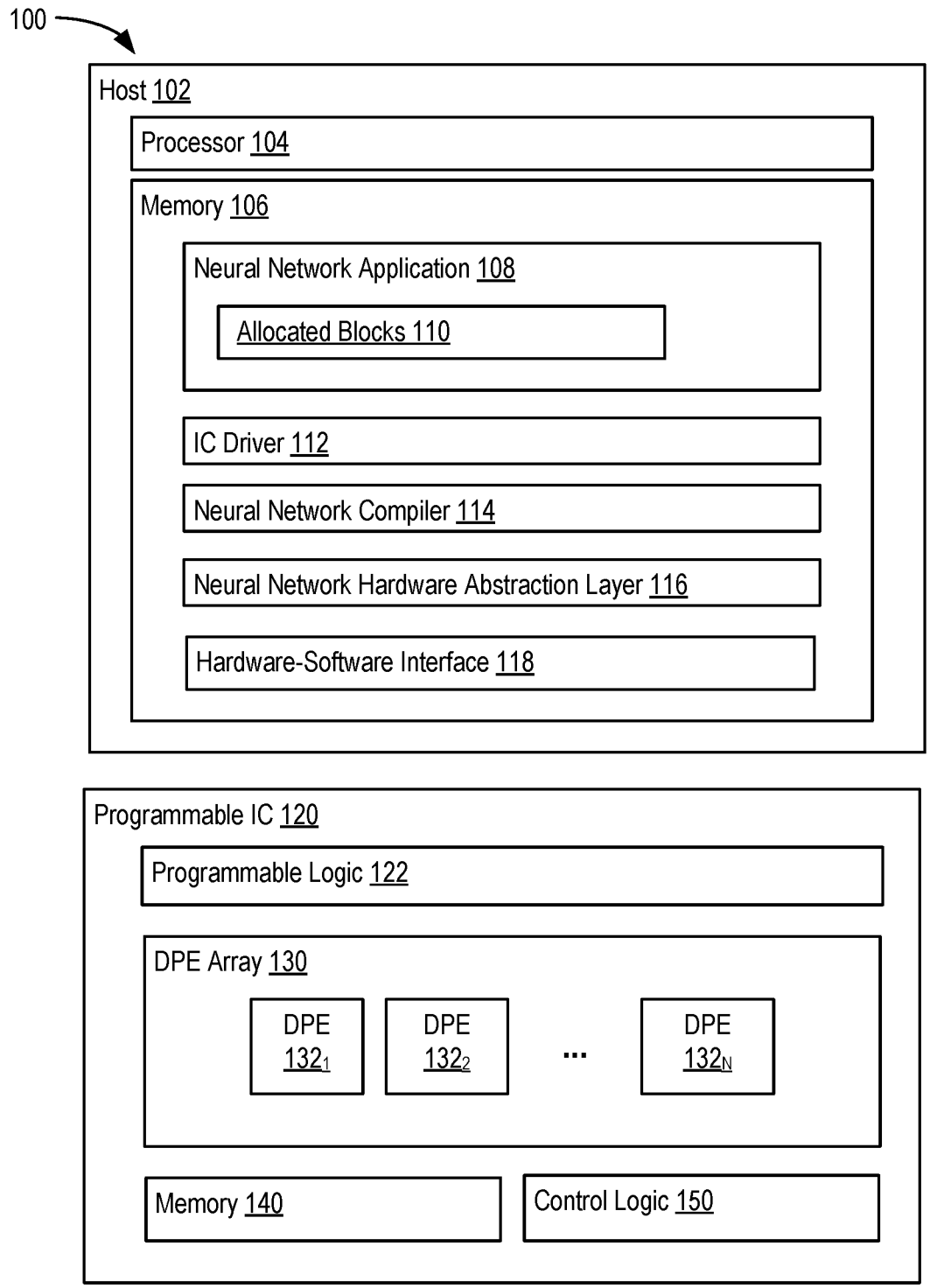
FIG. 1 is a block diagram of the architecture of an integrated circuit (IC) in use with a host computer, in accordance with the embodiment disclosed.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe a compiler and hardware-abstraction-layer architecture for a programmable integrated circuit (IC). The complexity of mapping and porting a neural network to the programmable IC is abstracted by exporting a set of application programming interfaces (APIs). A software developer with minimal know how on hardware design can attach their network description of the neural network to the API and map/port their neural networks to FPGA for acceleration. The API takes the network description of the neural network in a high level abstraction. The compiler generates a network graph and a corresponding execution sequence vector based on the network description and optimally allocates buffer handles for each of the layers in the network graph. The hardware abstraction layer, then, takes the network graph, the corresponding execution sequence vector, and the handles allocated by the compiler, sets up the hardware runtime parameters, and schedules the commands in the network graph and corresponding execution sequence vector to respective hardware blocks on a programmable IC.

One type of programmable IC that may work for processing and accelerating data passing through the layers of DNNs are FPGAs, which have many lookup arrays, available on-chip storage, and digital signal processing units. Using these FPGA components, an exemplary software design to take in a neural network and configure the programmable IC to execute the DNN is described herein. While the present disclosure discusses a software design to configure a neural network, the present disclosure is not limited to neural networks or deep neural networks and can include other types of machine learning frameworks.

FIG. 1 is a block diagram 100 of the architecture of a programmable integrated circuit (IC) 120 in use with a host computer 102, in accordance with the embodiment disclosed.

In one embodiment, the programmable IC 120 includes programmable logic 122, a DPE array 130 having multiple DPEs 1321-132N, memory 140, and control logic 150. In one embodiment, the control logic 150 configures the programmable logic 122, and the programmable logic uses run-time parameters from the control logic 150 to control the DPE array 130. For example, using a received bitstream that contains configuration data, control logic 150 can configure the programmable logic 122 (which can include a plurality of configurable logic blocks) with run-time parameters, and the programmable logic 122 controls the DPE array 130 that has any number of DPEs ($132_1$-$132_N$). For example, the programmable logic 122 can include look up tables, function generators, registers, multiplexers, and the like.

In one embodiment, the programmable IC includes a DPE array 130 having any number of DPEs, and each DPE comprises specialized circuitry to connect an array of neural network units (NNU) (not illustrated). In one embodiment, the NNUs of the DPEs comprise non-programmable logic i.e., are hardened specialized processing elements, and comprise hardware elements including, but not limited to, program memories, an instruction fetch/decode unit, fixed-point vector units, floating-point vector units, arithmetic logic units (ALUs), and multiply accumulators (MAC). The detailed circuitry within the memory 140 can include any type of volatile or nonvolatile memory. In one embodiment, the memory 140 includes an array of memory elements.

In one embodiment, the host computer 102 (also referred herein as a host) comprises a processor 104 and memory 106. In one embodiment, the memory 106 comprises a neural network application 108 with allocated blocks 110 and an IC driver 112. The memory 106 also includes a neural network compiler 114 (also referred herein as a compiler), a neural network hardware abstraction layer 116 (also referred herein as a HAL), and a hardware-software interface 118 for the programmable IC 120. While FIG. 1 illustrates the compiler 114, the HAL 116, and the hardware-software interface 118 runs on the host computer, this does not limit which component runs the compiler 114, the HAL 116, and the hardware-software interface 118. That is, the compiler 114, the HAL 116, and the hardware-software interface 118 can run on the host computer 102 or on the programmable IC 120. For example, in some embodiments, the compiler 114, the HAL 116, and the hardware-software interface 118 can run on a processor on the programmable IC 120, and in other embodiments, the compiler 114 and the HAL 116 run on the host computer 102 while the hardware-software interface 118 runs on a processor in the programmable IC 120. The detailed circuitry within the memory 106 is described below, but can include any type of volatile or nonvolatile memory (e.g., DRAM). In one embodiment, the memory 106 includes an array of memory elements. In one embodiment, the memory 106 stores input image data, such as input feature maps, and activation outputs from various and/or previous layers of the DNN. Details about the compiler 114, the HAL 116, and the hardware-software interface 118 are provided below with regards with FIG. 2.

Figure 2:
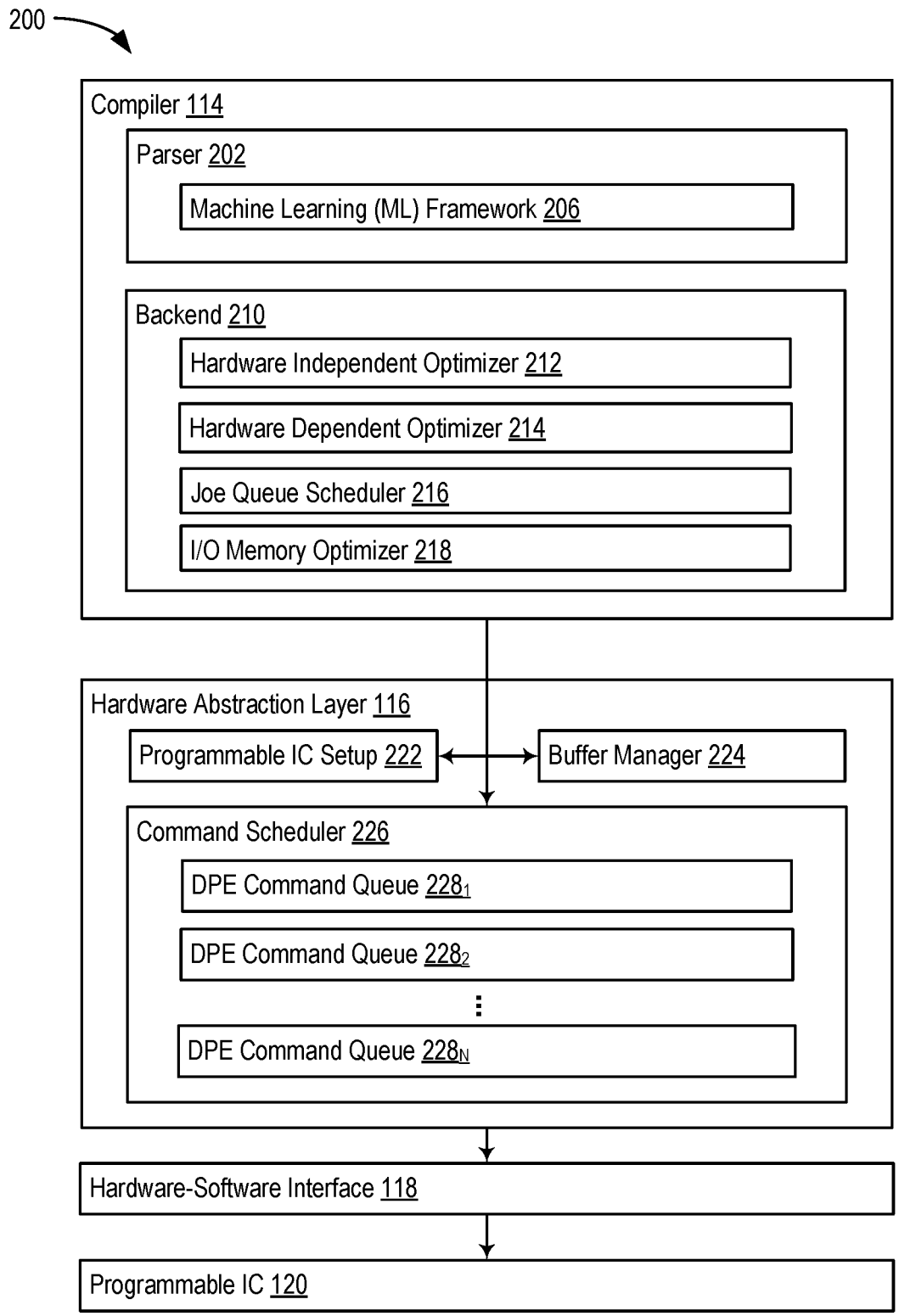
FIG. 2 is a block diagram of the compiler and the hardware abstraction layer to be used with a hardware-software interface to communicate with the programmable IC.

FIG. 2 is a block diagram 200 of the compiler 114 and the HAL 116 to be used with a hardware-software interface 118 to communicate with the programmable IC 120. As mentioned with FIG. 1, the host computer 102 includes a compiler 114 and a HAL 116 for use with a DNN inference accelerator (also referred herein as a programmable IC). In one embodiment, the compiler 114 exports an application program interface (API) to the host computer 102. This exported API takes in a network description of a DNN in various framework specific formats (e.g., deploy.prototxt of the caffe framework) and generates an intermediate hardware-dependent representation of the network. The HAL 116 takes this intermediate representation of the network and programs the hardware for execution using the hardware-software interface 118.

In one embodiment, the compiler 114 has two components: the front-end parser 202 and the backend 210. The front-end parser 202 takes the network description in framework specific formats and generates a framework independent network graph. The backend 210 refines this framework-independent and hardware-agnostic network graph into a hardware-dependent graph. In one embodiment, the HAL 116 takes the hardware-dependent graph from the compiler 114 and sets up the hardware runtime parameters of the programmable IC 120, allocates the buffers needed by the programmable IC hardware for processing the network, and schedules the nodes in the hardware-dependent graph into respective hardware execution queues. The command scheduler 226 of the HAL 116 then invokes the programmable IC through the hardware-software interface 118.

In one embodiment, the parser 202 provides an interface to various deep learning network frameworks 206 with an API, like an API exported by the compiler 114. The API takes inputs in the same format as the deep learning frameworks do. Accordingly, the parser 202 takes models trained using various deep learning network frameworks 206 like caffe or TensorFlow and converts them to a network graph structure. In one embodiment, the network graph structure is an XGraph. In one embodiment, the graph structure converted by the parser 202 is a directed acyclic graph with heterogeneous nodes which encode information about various network layers and their connectivity. An example of a directed acyclic graph is presented in FIG. 3.

In one embodiment, the backend 210 of the compiler 114 works on the network graph structure (generated by the parser 202) and performs operations on the network graph structure to generate an execution sequence vector. The execution sequence vector comprises a sequential queue of the layers of the network graph structure. Details about the execution sequence vector are provided below. The backend 210 comprises a hardware independent optimizer 212, a hardware dependent optimizer 214, a job queue scheduler 216 and an IO memory optimizer 218. Each of these components in the backend 210 works to perform operations on the network graph structure and generate an execution sequence vector to pass onto the HAL 116.

To improve the efficiency of the DNN, the compiler 114 can perform several layers of optimizations and layer fusion operations onto the network graph structure. Consequently, the network graph structure has updated layers and buffers and is structured with the HAL 116. In one embodiment, the hardware independent optimizer 212 performs optimizations (also referred herein as optimization rules) of the DNN that do not require or impact the hardware aspects of the DNN. Some of these optimizations performed by the hardware independent optimizer 212 include: parallel 1×1 convolutions fuse optimizations, software fuse optimizations, dropout optimizations, reshape optimizations, flatten optimizations, concatenation layer optimizations, custom layer optimizations, and prior box optimizations. Further, in one embodiment, the hardware dependent optimizer 214 performs optimizations of the DNN that do use or impact the hardware aspects of the DNN. Some of these optimizations performed by the hardware dependent optimizer 214 include: convolution+ReLU optimizations, hardware fusion optimization, CReLU optimizations, ElementWise (sometimes shortened to "Eltwise") Addition optimizations, ReLU optimizations, 3D separable convolution optimizations, and deconvolution optimizations.

In one embodiment, the optimizations performed by the hardware independent optimizer 212 include removal of layers used in the training phase of the DNN. With training layer removal optimization, the backend 210 of the compiler 114, specifically the hardware independent optimizer 212, identifies all the layers in the network graph which are not used during the interference phase and removes them.

Below is a table providing a list of OpCodes supported by the compiler 114. These opcodes correspond to various operations performed by layers of the DNN. In some embodiments, the opcodes correspond to operations resulting from an optimization by the hardware independent optimizer 212 or the hardware dependent optimizer 214. In some embodiments, the opcodes correspond to software operations.

TABLE 1

List of OpCodes Supported

| OpCode | Operation | PL IP name |
|---|---|---|
| 0 | Conv | ConvolutionForward |
| 1 | Conv+ReLU | ConvolutionForward |
| 2 | dilConv | ConvolutionForward |
| 3 | dilConv+ReLU | ConvolutionForward |
| 4 | BN intra SOS | ConvolutionForward |
| 5 | BN intra mean | ConvolutionForward |
| 6 | LRN intra SOS | ConvolutionForward |
| 7 | LRN inter SOS | ConvolutionForward |
| 8 | L2 norm | ConvolutionForward |
| 9 | LRN_PnS | ConvolutionForward |
| 10 | BN_SnB+ReLU | ConvolutionForward |
| 11 | Elem-wise Addition | ConvolutionForward |
| 12 | BN_SnB+ReLU+Conv | ConvolutionForward |
| 13 | BN_SnB | ConvolutionForward |
| 14 | BN | ConvolutionForward |
| 15 | BN_SnB+CReLU | ConvolutionForward |
| 16 | BN+CReLU | ConvolutionForward |
| 17 | Scale+ReLU | ConvolutionForward |
| 18 | Conv+CReLU | ConvolutionForward |
| 19 | 3DConv+Conv | ConvolutionForward |
| 20 | Maxpool | ConvolutionForward |
| 21 | Avgpool | ConvolutionForward |
| 22 | FC | ConvolutionForward |
| 23 | Pool+Conv | ConvolutionForward |
| 24 | 3d cony | ConvolutionForward |
| 25-99 | Reserved | |
| 100 | MAX_POOL | PoolFoward |
| 101 | AVR_POOL | PoolFoward |
| 102 | FC | FcForward |
| 103 | DECONV | DeconvForward |
| 104 | SEPARABLE_CONV | PoolFoward |
| 104-199 | Reserved | |
| | | Software function |
| 200 | SW_SOFTMAX | SWSoftmaxForward |
| 201 | SW_NMS | NMSForward |
| 202 | XPACK | PackDataToHardware |
| 203 | XUNPACK | UnpackDataToSoftware |
| 204 | XCUSTOM | custom |
| 205 | CROP | cropLayer |
| 206 | SW_PERM | PermuteForward |
| 207 | SW_L2NORM | NormalizationForward |

More detailed discussions about the various optimizations supported by the backend 210 are provided below.

In one embodiment, the HAL 116 works on the execution sequence vector generated by the compiler 114. The HAL 116 comprises three components: a buffer manager 224, a programmable IC setup component 222, and a command scheduler 226. The buffer manager 224 manages the constant buffers and I/O buffers in software and hardware. The programmable IC setup component 222 calibrates the hardware run-time parameters for each command for each command/node in the sequence vector and sets up the buffers and run-time scalar arguments needed by the hardware for executing the command/node in the sequence vector. The command scheduler 226 schedules the commands in the execution sequence vector onto the programmable IC components (hardware and software).

In one embodiment, the buffer manager 224 allocates the buffers required for both the hardware and software in an efficient way, such as constant buffers and I/O buffers. The buffer manager 224 takes the sequence vector generated by the backend 210 as input and organizes the buffers. In one embodiment, the buffer manager 224 outputs a sequence vector with updated buffer pointers. The buffer manager 224 keeps track of a list of pointers allocated for software and hardware blocks, and the buffer manager 224 uses the list for releasing memory. Further discussion of the buffer manager 224 is provided with regards to FIGS. 15-17.

In one embodiment, the programmable IC setup component 222 loads the constants buffers and computes the scalar parameters required to program the programmable IC 120. The programmable IC setup component 222 receives the execution sequence vector from the buffer manager 224, which initializes the buffer pointers and offsets for each layer in the execution sequence vector. The programmable IC setup component 222 converts the weights and parameters of the DNN to fixed point format and loads them into the constant buffers managed by the buffer manager 224 using the pointers and offsets in the execution sequence vector. In one embodiment, the programmable IC setup component 222 uses a prescribed layer, optimized for hardware performance, for the data in the constant buffers managed by the buffer manager 224.

In one embodiment, the HAL 116 also comprises a command scheduler 226 that efficiently dispatches commands in the execution sequence vector to the programmable IC for processing. The command scheduler is further detailed with regards to FIG. 18.

Figure 3:
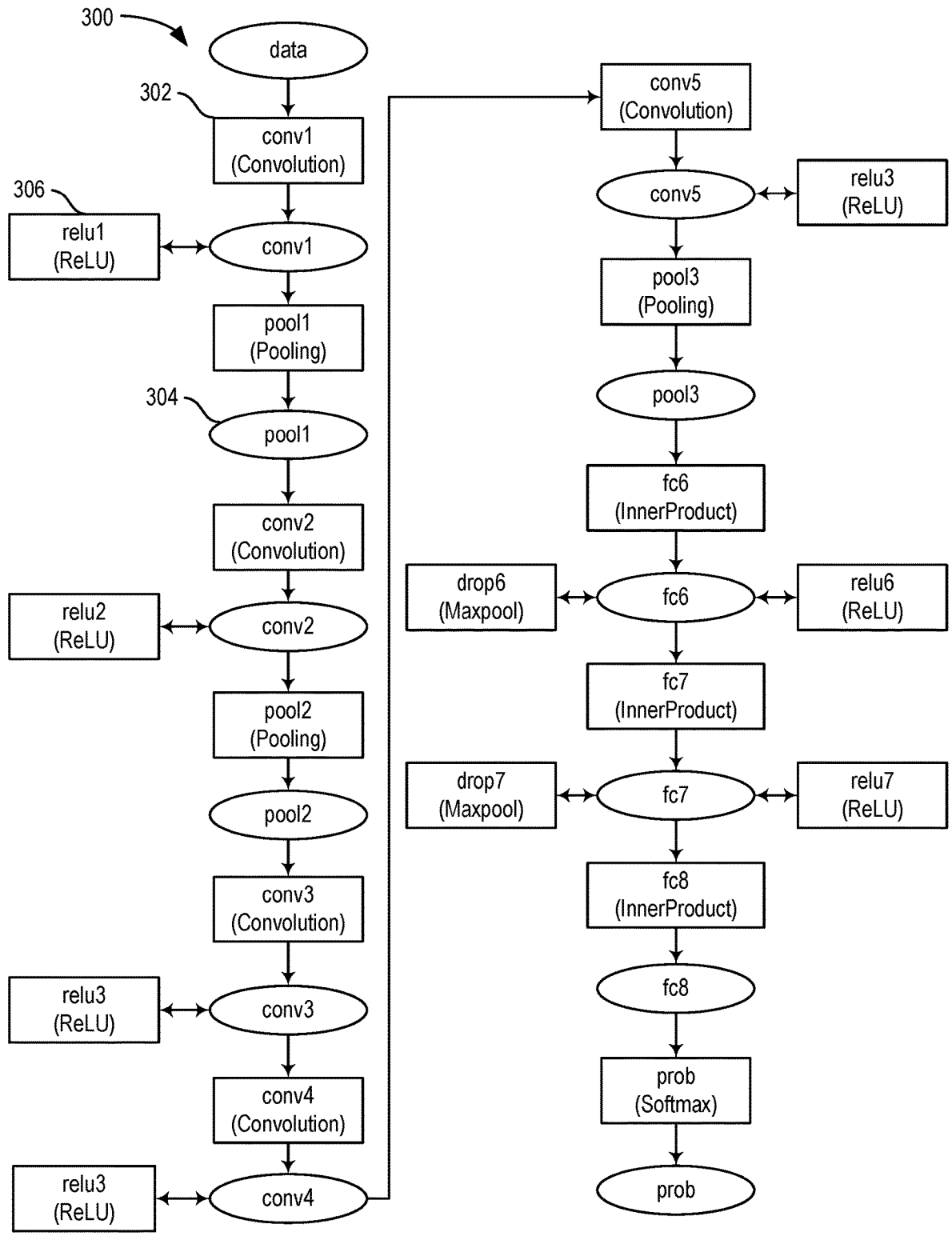
FIG. 3 is a graphical representation of a network graph, according to embodiments of the present disclosure.

FIG. 3 is a graphical representation of a network graph, according to embodiments of the present disclosure, which can be applied to a programmable IC 120 for execution. In one embodiment, the network graph 300 comprises layers of a DNN and buffers between the layers of the network. As illustrated, the rectangular elements of network graph 300 represent the layers of the DNN, and the oval elements of network graph 300 represent buffers between the layers, such as buffer element 304 between layer elements 302 and 306. Some layer elements of the network graph 300 indicate Rectified Linear Unit (ReLU) operations, and in some embodiments, the ReLU operations store the results in the buffer of the preceding layer node, as illustrated in the network graph 300.

Figure 4A:
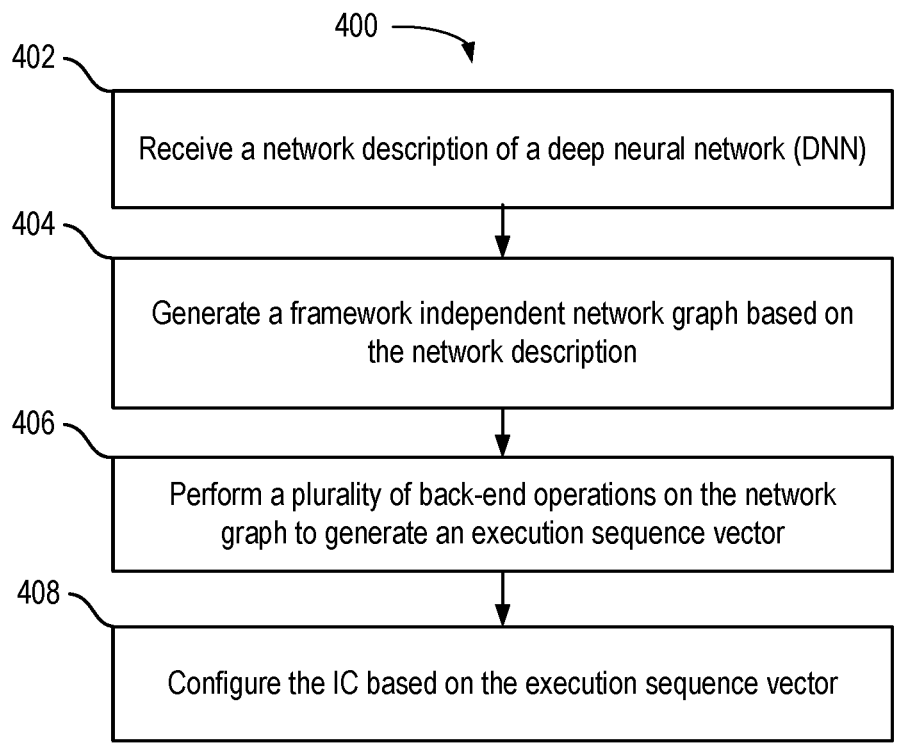
FIGS. 4A-D illustrate example operations performed by a compiler and a hardware abstraction layer for a programmable IC, according to embodiments of the present disclosure.

FIG. 4A illustrates example operations performed by a compiler 114 and a HAL 116 to apply a DNN such as the network graph 300 of FIG. 3 to a programmable IC 120 for execution, according to embodiments of the present disclosure.

Operations 400 begin, at 402, with the compiler 114 receiving a network description of a neural network. In one embodiment, a user provides the network description of the neural network to an API, and the API in turn transmits the network description to the compiler 114 on the host computer 102. In some embodiments, the network description uses framework specific formats (e.g., caffe, TensorFlow).

At 404, operations 400 continue with the compiler 114 generating a framework independent network graph based on the network description. After the compiler 114 receives the network description, the compiler 114 generates a network graph using the network description of the neural network. In one embodiment, the compiler 114 determines what type of machine learning framework 206 the network description uses. Based on the type of framework 206, the compiler 114 converts the description to a network graph having layer nodes. In one embodiment, the network graph generated is an intermediate hardware-agnostic graph.

At 406, operations 400 continue with the compiler performing a plurality of back-end operations on the network graph to generate an execution sequence vector. In certain embodiments, the back-end operations include optimizations to the network graph and allocation of buffer handles. In some embodiments, the back-end operations include generating an execution sequence vector based on a network graph generated from the network description of the neural network. In one embodiment the execution sequence vector is further based on buffer handles allocated for a plurality of layers in the network graph. In one embodiment, the executions sequence vector comprises a plurality of commands corresponding to the layers of the neural network. As illustrated in FIG. 3, the layer nodes of the neural network graph apply an operation on the data passing through the neural network, and the commands of the execution sequence vector correspond to the operations of the layers of the neural network. Further details about generating the execution sequence vector is provided below with reference to FIG. 4B.

At 408, operations 400 continue with the HAL 116 configuring the IC based on the execution sequence vector. In some embodiments, configuring the IC based on the execution sequence vector includes the HAL 116 calibrating a plurality of hardware runtime parameters of the programmable IC based on the execution sequence vector. Once the compiler 114 generates the execution sequence vector, the compiler 114 passes the execution sequence vector to the HAL 116 for further processing. In some embodiment, once the HAL 116 receives the execution sequence vector, the HAL 116 begins to setup the hardware components of the programmable IC 120, and in some embodiments, setup includes calibrating the hardware runtime parameters. In some embodiments, the HAL 116 allocates buffers on the programmable IC 120 required by both hardware components and software components based on the execution sequence vector. In such embodiments, the execution sequence vector also includes information about buffer nodes of the network graph. In one embodiment, the HAL 116 keeps track of a list of pointers for allocated buffers corresponding to the buffer nodes of the network graph.

In some embodiments, configuring the IC based on the execution sequence vector includes the HAL 116 scheduling the plurality of commands of the execution sequence vector for a plurality of components of the programmable IC. Because the commands in the execution sequence vector correspond to the operations of the layer nodes of the network graph, the HAL 116 schedules when to transmit the commands of the execution sequence vector to the programmable IC 120. When the programmable IC 120 receives the commands from the HAL 116 via the hardware-software interface 118, the programmable IC begins executing the operation corresponding to the command. The operation is based on the layer nodes of the network graph. In one embodiment, the plurality of components of the programmable IC 120 include the programmable logic 122 with the plurality of controllers, the DPE array 130, the memory 140, and the control logic 150. Further details about the HAL 116 scheduling the commands of the execution sequence vector are provided with respect to FIG. 18-20.

Figure 4B:
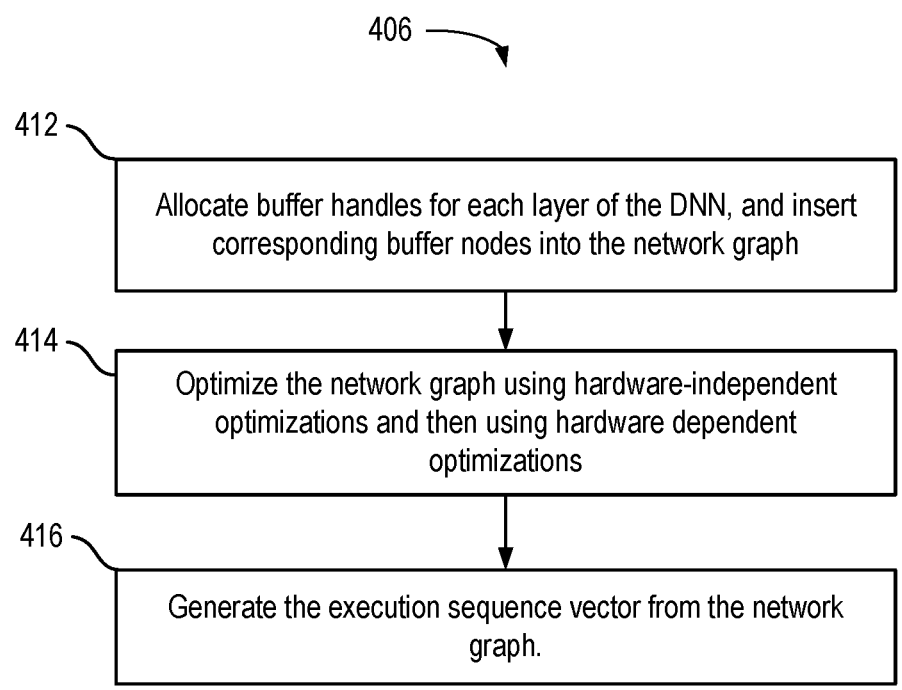

FIG. 4B illustrates further example operations performed by the compiler 114. Specifically, FIG. 4B is a flowchart diagramming the back-end operations that the compiler 114 performs on the network graph to generate the execution sequence vector, which drives the configuration of the programmable IC 120 for processing a neural network.

At block 412, the compiler 114 allocates buffer handles for each layer of the neural network. In some embodiments, the compiler 114 also inserts corresponding buffer nodes between the layer nodes to get a network graph such as the network graph 300 of FIG. 3. In some embodiments, buffer handles comprise blocks of memory dedicated to corresponding buffers.

After allocating buffer handles for the neural network, at block 414 the compiler 114 optimizes the network graph using hardware-independent optimizations and hardware dependent optimizations. Optimization of the network graph can improve the efficiency of data passing through the neural network. Table 1 provided some types of optimizations performed by the compiler 114 to the generated network graph. FIGS. 5-12 also illustrate various example optimizations performed by the compiler 114 on the generated network graph. In some embodiments, the compiler 114 performs hardware independent optimizations on the network graph before performing hardware dependent optimizations. In such embodiments, if the compiler 114 performs hardware dependent optimizations before hardware independent optimizations, the compiler 114 may have to replay some hardware dependent optimizations in order to achieve the same resulting network graph or the optimized network graph may produce different output data compared to output data from a network graph optimized using hardware independent optimizations first. In some embodiments, the compiler 114 can perform any number of optimizations on the network graph to increase efficiency.

After the network graph is optimized, operations 404 continue with the compiler 114 generating the execution sequence vector from the optimized network graph. Details about generating the execution sequence vector are provided with respect to FIG. 4C.

Figure 4C:
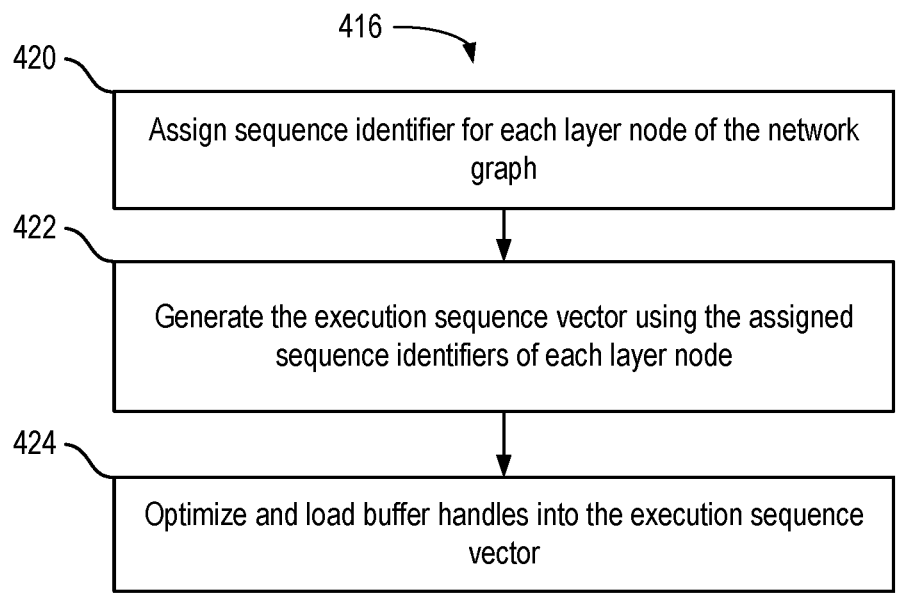

FIG. 4C illustrates further example operations performed by the compiler 114. Specifically, FIG. 4C is a flowchart diagramming how the compiler 114 generates the execution sequence vector from the optimized network graph. In some embodiments, block 416 of FIG. 4B comprises the operations in FIG. 4C.

Figure 13:
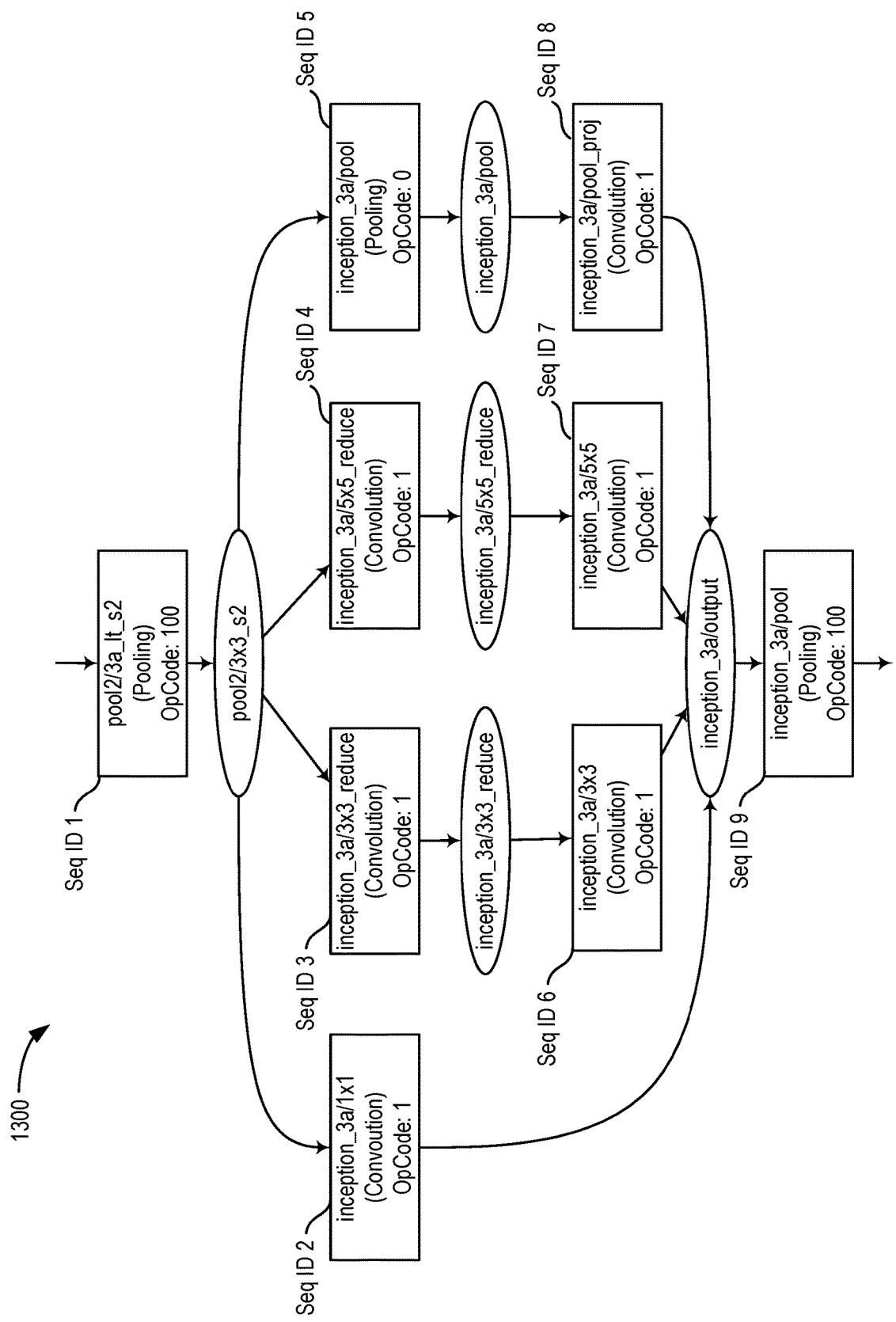
FIG. 13 depicts an example assignment of sequence identifiers to layers of a network graph, according to embodiments of the present disclosure.

After the compiler 114 finishes optimizing the network graph (both hardware independent optimizations and hardware dependent optimizations), the compiler 114 uses the job queue scheduler 216 for generating the execution sequence vector. In one embodiment, operations 416 begin at block 420 with the compiler 114, using the job queue scheduler 216, applying a breadth-first search to assign sequence identifiers to each layer node of the network graph. An example of an assignment of sequence identifiers to the layer nodes of the network graph is illustrated in FIG. 13.

After assigning sequence identifiers, the operations 416 continue at 422 with the compiler 114 generating the executing sequence vector using the assigned sequence identifiers for each layer node. In one embodiment, the execution sequence vector is illustrated as a table, such as Table 2 shown below. In such embodiment, the execution sequence vector details the sequence identifier, the layer type, the previous sequence identifiers, and the next sequence identifiers for each layer node of the network graph. Further details about the contents and structure of the execution are provided below with respect to FIG. 13 and Table 2.

After generating the execution sequence vector, operations 416 continue at 424 with the compiler 114 optimizing and loading buffer handles into the execution sequence. In one embodiment, the execution sequence vector details the buffer handles or allocated memory blocks for data passing through each layer node of the network graph. Further details about buffers and buffer optimization are provided below with respect to FIG. 14.

Figure 4D:
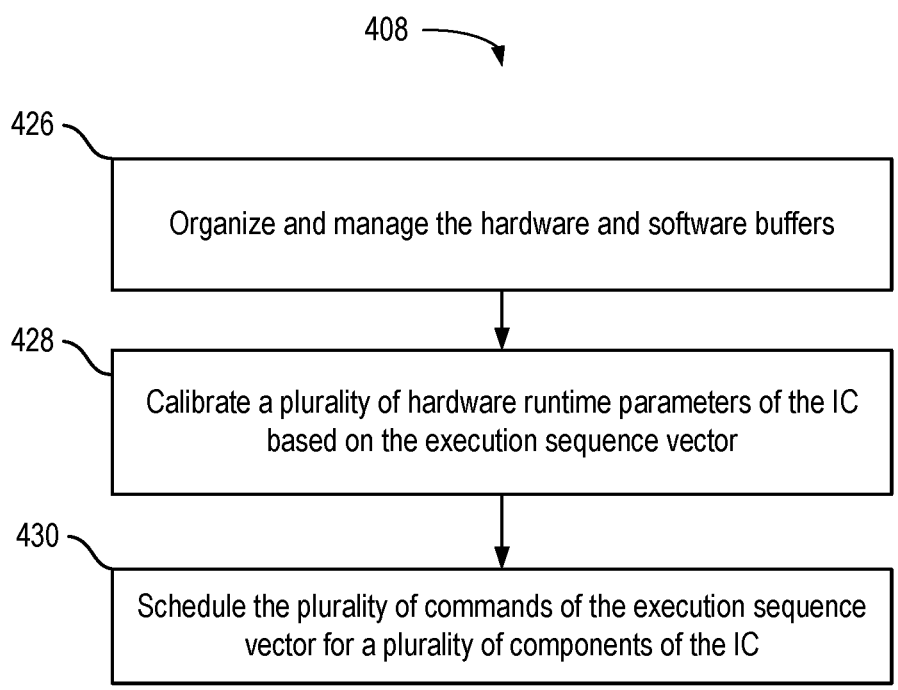

FIG. 4D illustrates further example operations performed by the HAL 116. Specifically, FIG. 4D is a flowchart diagramming how the HAL 116 configures the IC based on the execution sequence vector. In some embodiments, block 408 of FIG. 4A comprises the operations in FIG. 4D.

After the compiler 114 performing back-end operations to generate the execution sequence vector, the compiler 114 sends the execution sequence vector to the HAL 116. In one embodiment, operations 408 begin at block 426 with the HAL 116, using the buffer manage 224, organizing and managing the hardware and software buffers. Further discussion of the buffer manager 224 is provided below with respect to FIG. 15.

After organizing the buffers, the operations 408 continue at 428 with the HAL 116 calibrating a plurality of hardware runtime parameters of the IC based on the execution sequence vector. In one embodiment, calibrating the plurality of hardware runtime parameters of the IC comprises computing scalar parameters to program the IC. Further details about calibrating the hardware runtime parameters are provided below with respect to FIG. 15.

After calibrating the hardware runtime parameters, operations 408 continue at 430 with the HAL 116 scheduling the plurality of commands of the execution sequence vector for the plurality of components of the IC. In one embodiment, scheduling the plurality of commands of the execution sequence vector for the plurality of components of the IC includes dispatching the plurality of commands to DPEs of the IC for processing. In another embodiment, scheduling the plurality of commands of the execution sequence vector for the plurality of components of the IC comprises separating the plurality of commands into a plurality of command queues based on a processing element used to process a command; determining whether the command has dependencies; and asynchronously dispatching the command to the processing element for processing. In one embodiment, scheduling the plurality of commands includes receiving a command completion response from the processing element; and asynchronously dispatching a next command to the processing element. Further details about buffers and buffer optimization are provided below with respect to FIGS. 15 and 18.

Figure 5A:
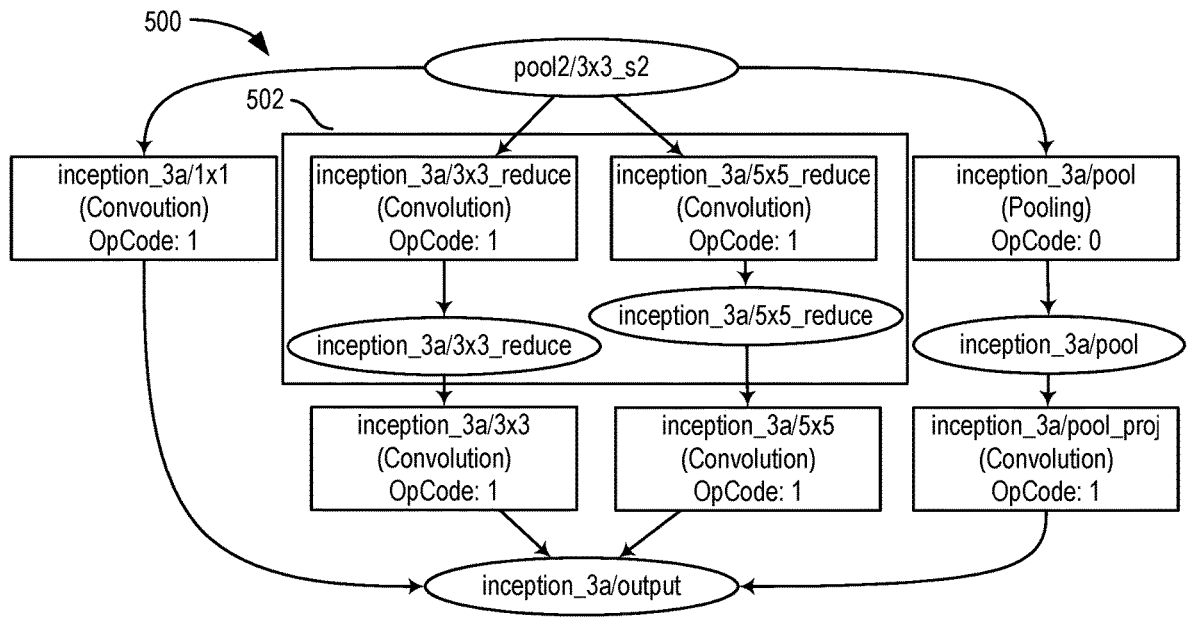
FIGS. 5A-B depict an example optimization of a network graph, according to embodiments of the present disclosure.
Figure 5B:
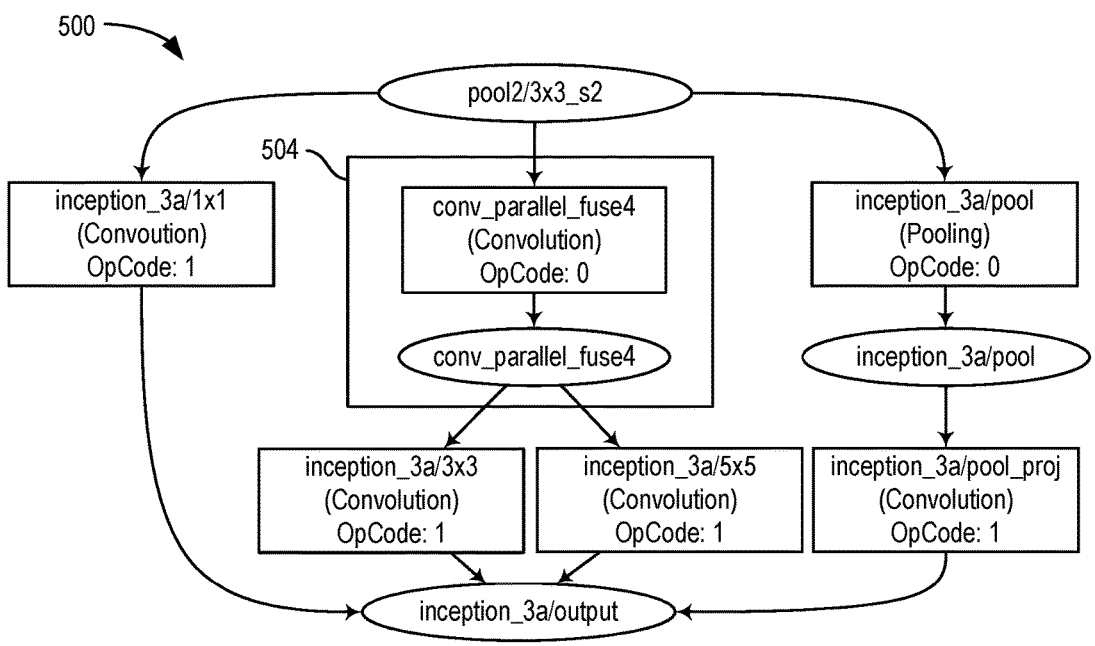

FIGS. 5A-B depict an example optimization of a network graph, according to embodiments of the present disclosure. As mentioned, the compiler 114 receives a network description of a neural network and generates a network graph based on the received network description. The compiler 114 then optimizes the network graph by passing the network graph through the hardware independent optimizer 212 and through the hardware dependent optimizer 214. One type of optimization performed by the hardware independent optimizer 212 is a parallel [1×1] convolution fusion optimization, which is illustrated in FIGS. 5A and 5B. With a parallel convolution fusion optimization, the backend 210 of the compiler 114, specifically the hardware independent optimizer 212, identifies network topology regions of the network graphs where multiple convolution layers take the same input buffer and write to different output buffers and merge these convolution layers into one layer. The merged convolution layer attaches to an output buffer with a size enough to hold the output of all the convolution layers merged. Also, the hardware independent optimizer 212 of the backend 210 registers the offsets of each convolution layer's output into the new output buffer for processing of downstream layers in the network graph.

FIG. 5A illustrates a network graph 500 for the hardware independent optimizer 212 to optimize. In one embodiment, the hardware independent optimizer 212 identified the layers and buffers inside the box 502 for optimization, and optimizes the network graph 500 by fusing the convolution layer nodes and the corresponding buffer nodes of the network graph together. FIG. 5B illustrates the network graph 500 after parallel [1×1] convolution fusion optimization, with box 504 having a single convolution fusion layer node and a single corresponding buffer node, the input going into the convolution nodes of box 504 the same as the input going into the nodes of box 502 prior to optimization and the output coming out of the convolution nodes of box 504 the same as the output coming out of the nodes of box 502 prior to optimization. After optimization of the network graph, the compiler 114 can proceed forward with generating the execution sequence vector, using example operations in FIG. 4C.

Figure 6A:
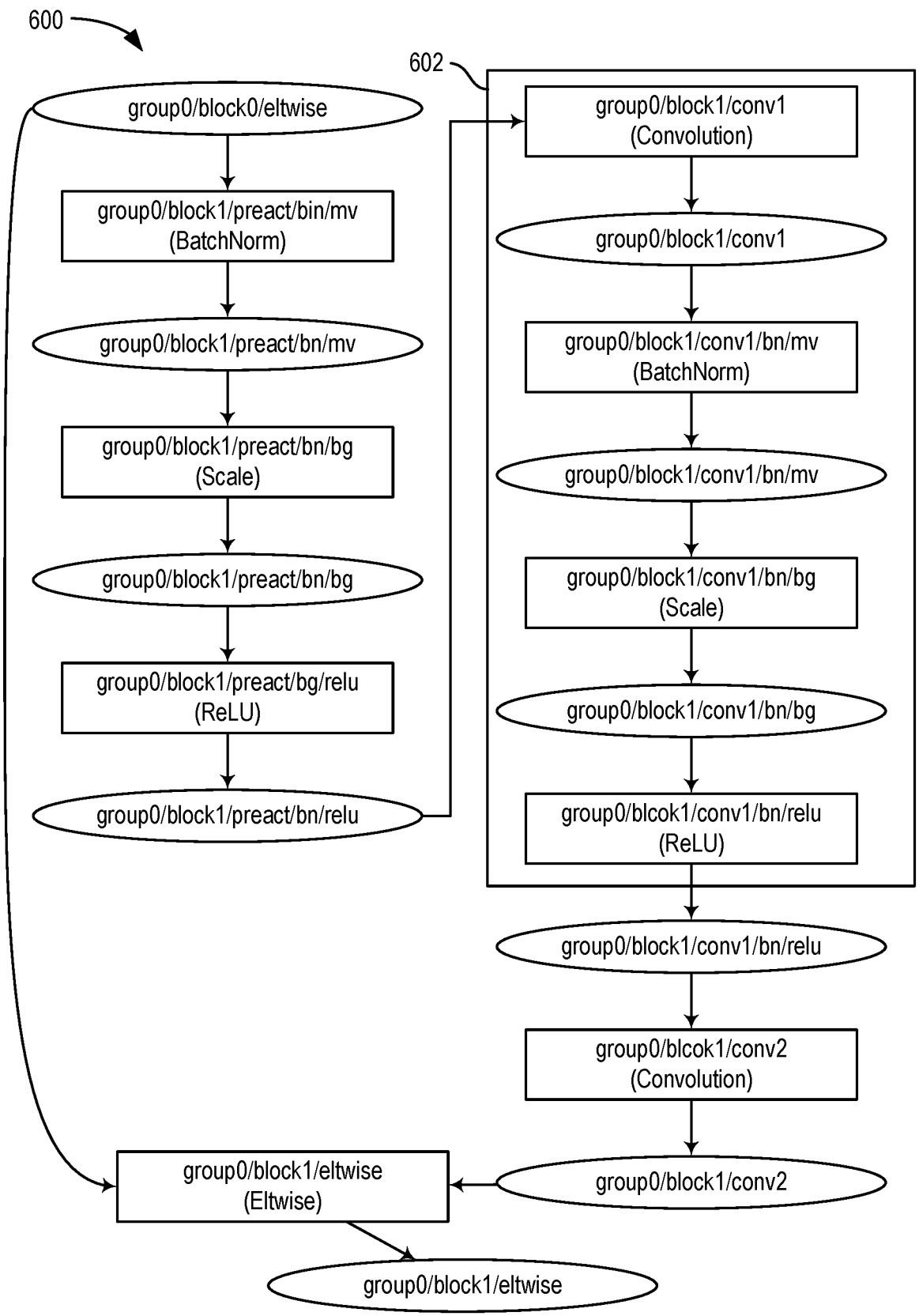
FIGS. 6A-B depict an example optimization of a network graph, according to embodiments of the present disclosure.
Figure 6B:
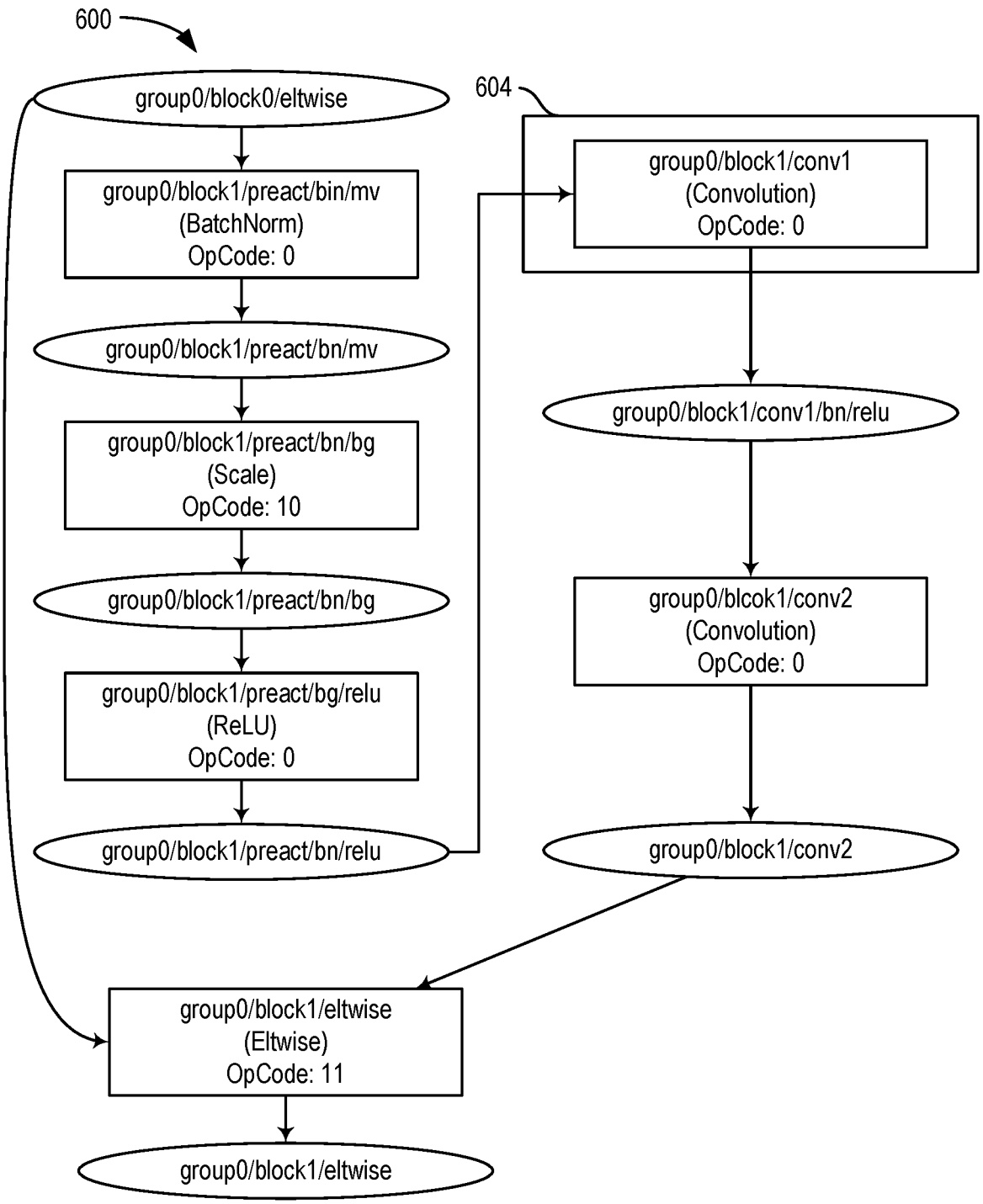

FIGS. 6A-B depict another example optimization of a network graph performed by the compiler 114 to generate the execution sequence vector, according to embodiments of the present disclosure. In one embodiment, FIGS. 6A and 6B illustrate an example pre-execute fusion optimization. With a pre-execute fusion optimization, the backend 210 of the compiler 114, specifically the hardware independent optimizer 212, looks up for a pattern of convolution layers followed by batch-norm layers followed by scale layers, and fuses the three layers into one convolution layer, by merging the parameters and weights of the input convolution, batch-norm, and scale layers. This optimization gets rids of the buffers connecting the layers, and therefore reduces the buffer requirements to execute the network. In some embodiments, the pre-execute fusion optimization applies to convolution layers, batch-norm layers, and scale layers of any order, combination, or arrangement.

FIG. 6A illustrates the network graph 600 for the hardware independent optimizer 212 to optimize. Specifically, in one embodiment, the hardware independent optimizer 212 identifies the convolution layers, the batch-norm layers, the scale layers and corresponding buffers inside the box 602 for optimization. The hardware independent optimizer 212 optimizes the network graph 600 by fusing these identified layer nodes and the buffer nodes inside box 602 together.

FIG. 6B illustrates the network graph after the pre-execution fusion optimization, with box 604 having a single convolution fused layer node, the input going into nodes of box 604 the same as the input going to the nodes of box 602 prior to optimization, and the output coming out of the nodes of box 604 the same as the output coming out of the nodes of box 602 prior to optimization. After optimization of the network graph, the compiler 114 can proceed forward with generating the execution sequence vector, using example operations in FIG. 4C.

Figure 7A:
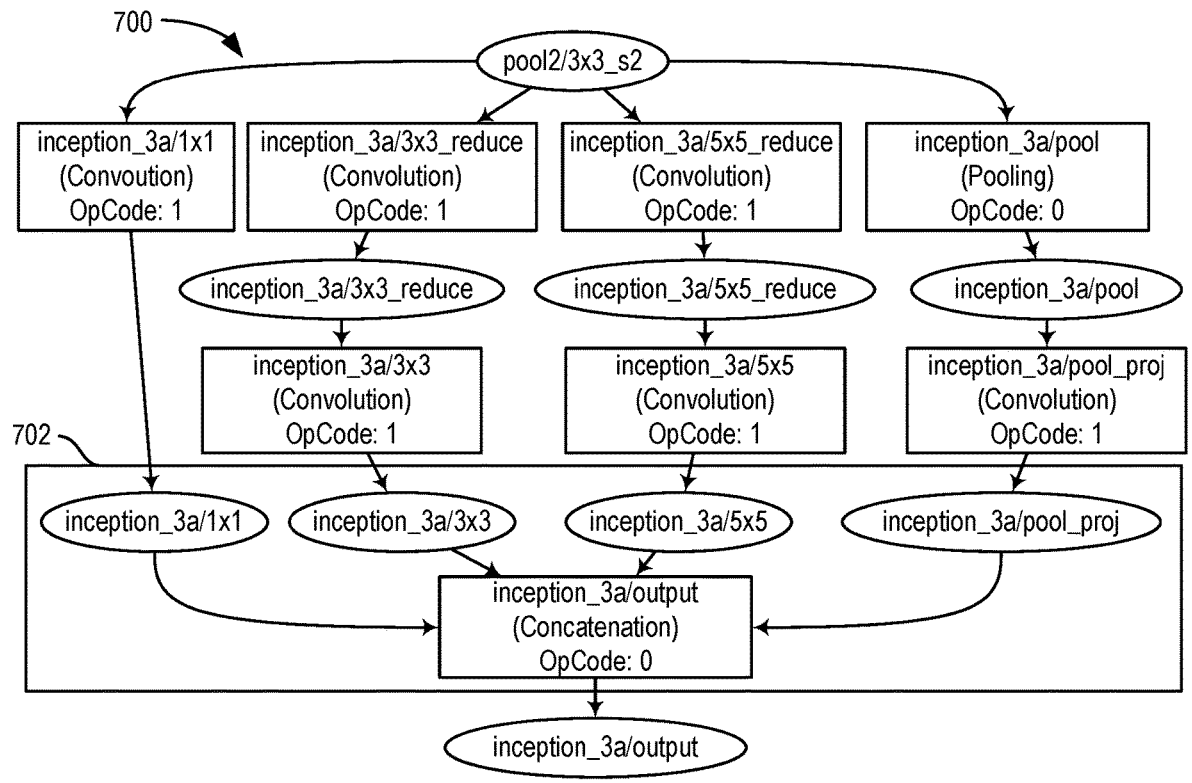
FIGS. 7A-B depict an example optimization of a network graph, according to embodiments of the present disclosure.
Figure 7B:
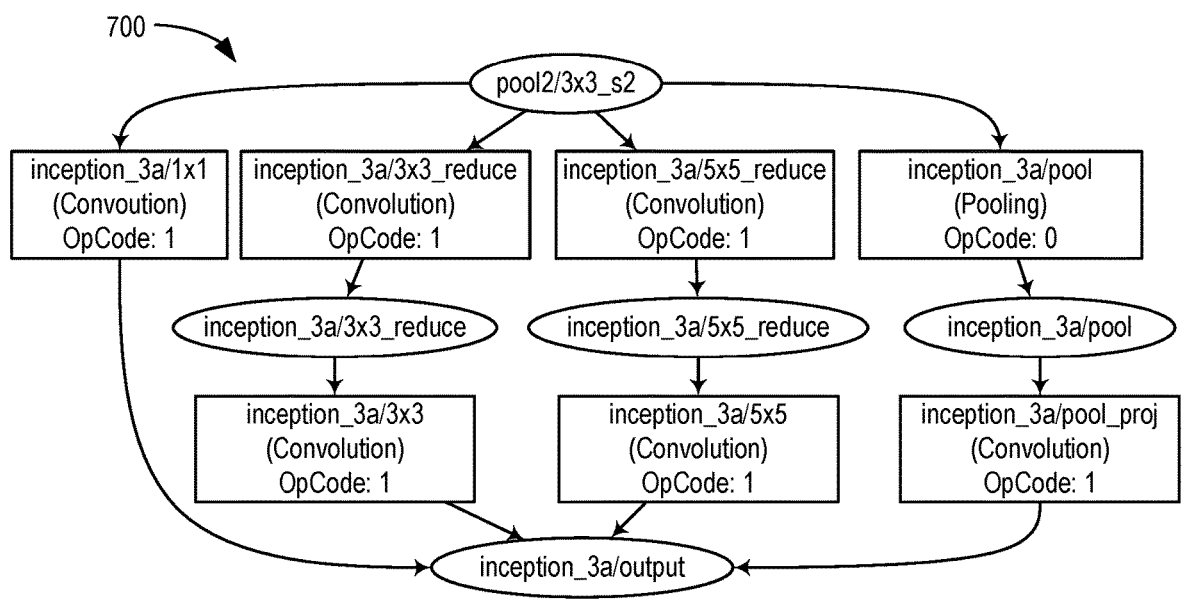

FIGS. 7A-B depict another example optimization of a network graph performed by the compiler 114 to generate the execution sequence vector, according to embodiments of the present disclosure. In one embodiment, FIGS. 7A and 7B illustrate an example concatenation layer optimization. In certain network topologies, a set of convolution layers write to their respective buffers and then the network graph introduces a concatenation layer to append the data from these various buffers into a single buffer. In one embodiment, the backend 210 of the compiler 114, specifically the hardware independent optimizer 212, identifies such network topologies and allocates a buffer large enough to hold the output data buffers from these convolution layers and assigns offsets into this larger buffer to each of the convolution layers. The convolution layers of the network graph then write to their respective regions in the larger buffer using the offsets assigned. In some embodiments, the concatenation layer optimization removes the concatenation layer node because the newly allocated buffer comprises enough space to hold all output data without concatenating the data together.

FIG. 7A illustrates a network graph 700 for the hardware independent optimizer 212 to optimize. Specifically in one embodiment, the hardware independent optimizer 212 identifies the concatenation layer and buffers preceding the concatenation layer inside the box 702 for concatenation layer optimization. The hardware independent optimizer 212 and optimizes the network graph 700 by removing all the buffer nodes and the concatenation layer node inside the box 702 and allocating the output buffer to have enough space to accommodate the output data from the preceding convolution layers. With concatenation layer optimizations, the layer nodes of the network graph 700 outside of the box 702 point to a new buffer node.

FIG. 7B illustrates the network graph after the concatenation layer optimization, and shows the removal of the concatenation layer. The input going into nodes of box 602 prior to the optimization now gets stored into the output buffer node that received the output of the nodes of box 602 prior to optimization. After optimization of the network graph, the compiler 114 can proceed forward with generating the execution sequence vector, using example operations in FIG. 4C.

FIGS. 8A-B depict another example optimization of a network graph performed by the compiler 114 to generate the execution sequence vector, according to embodiments of the present disclosure. In one embodiment, FIGS. 8A and 8B illustrate an example custom layer optimization. With custom layer optimization, the backend 210 of the compiler 114, specifically the hardware independent optimizer 212, allows a custom layer plugin to insert user-defined software routines of layers into the network graph. Allowing custom layers and user-defined software routines permits users to extend the functionality of the stack to networks which cannot be executed with the list of layers natively supported by the hardware and software. The hardware and software expects users to follow row-major organizations for all the input and output buffers for these customer layers.

FIG. 8A illustrates a network graph 800 for the hardware independent optimizer 212 to optimize. Specifically, in one embodiment, the hardware independent optimizer 212 identifies a custom layer in the network graph shown in box 802 and adds in layer nodes and buffer nodes into the network graph that correspond to this custom layer shown in box 804.

FIG. 8B illustrates the network graph 800 after the custom layer optimization with box 804 having more layer nodes and buffer nodes, but the input going to the nodes of box 804 being the same as the input going into the custom layer node in box 802 prior to optimization and the output coming out of the nodes of box 804 being the same as the output coming out of the nodes of box 802 prior to optimization.

Figure 9A:
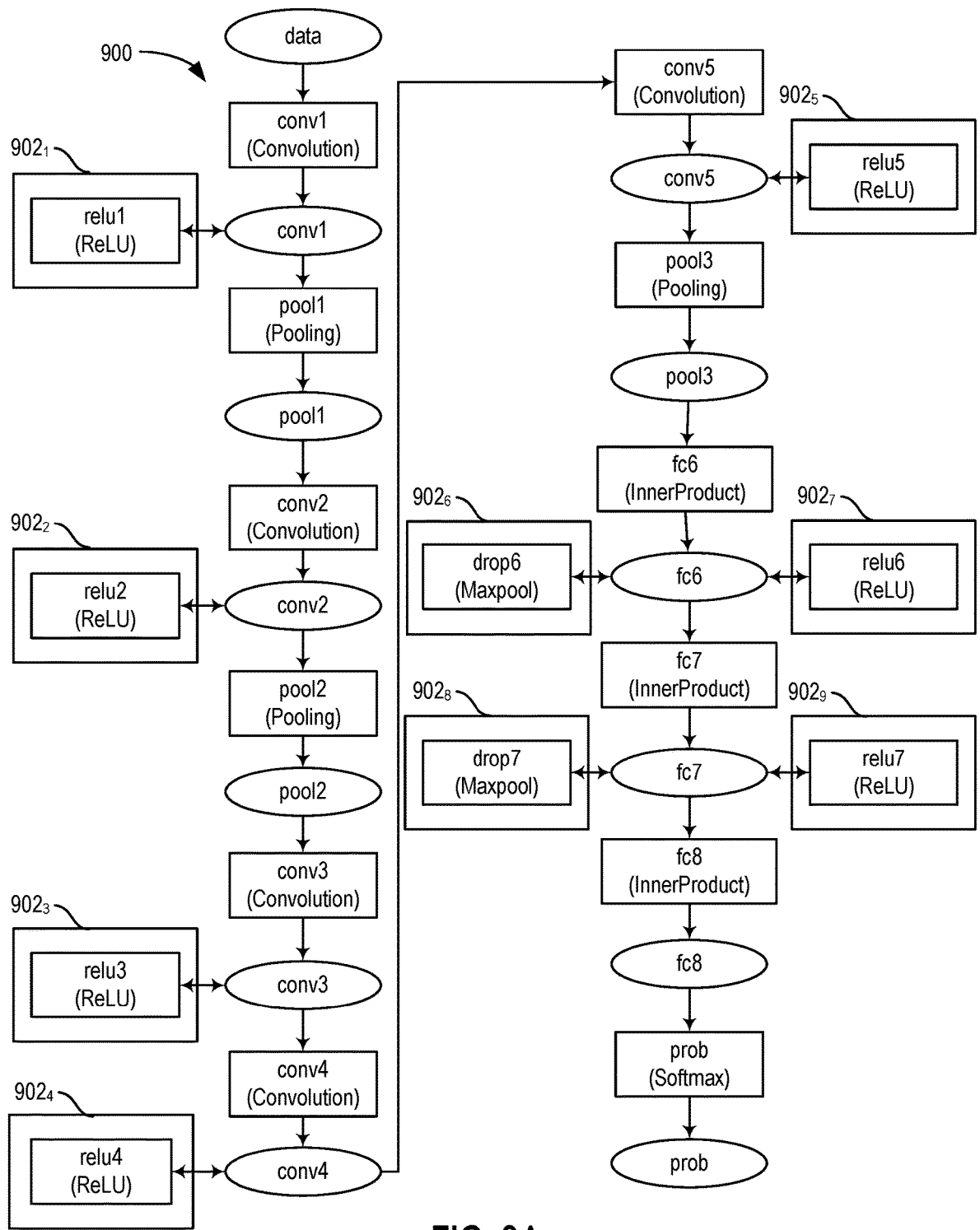
FIGS. 9A-B depict an example optimization of a network graph, according to embodiments of the present disclosure.
Figure 9B:
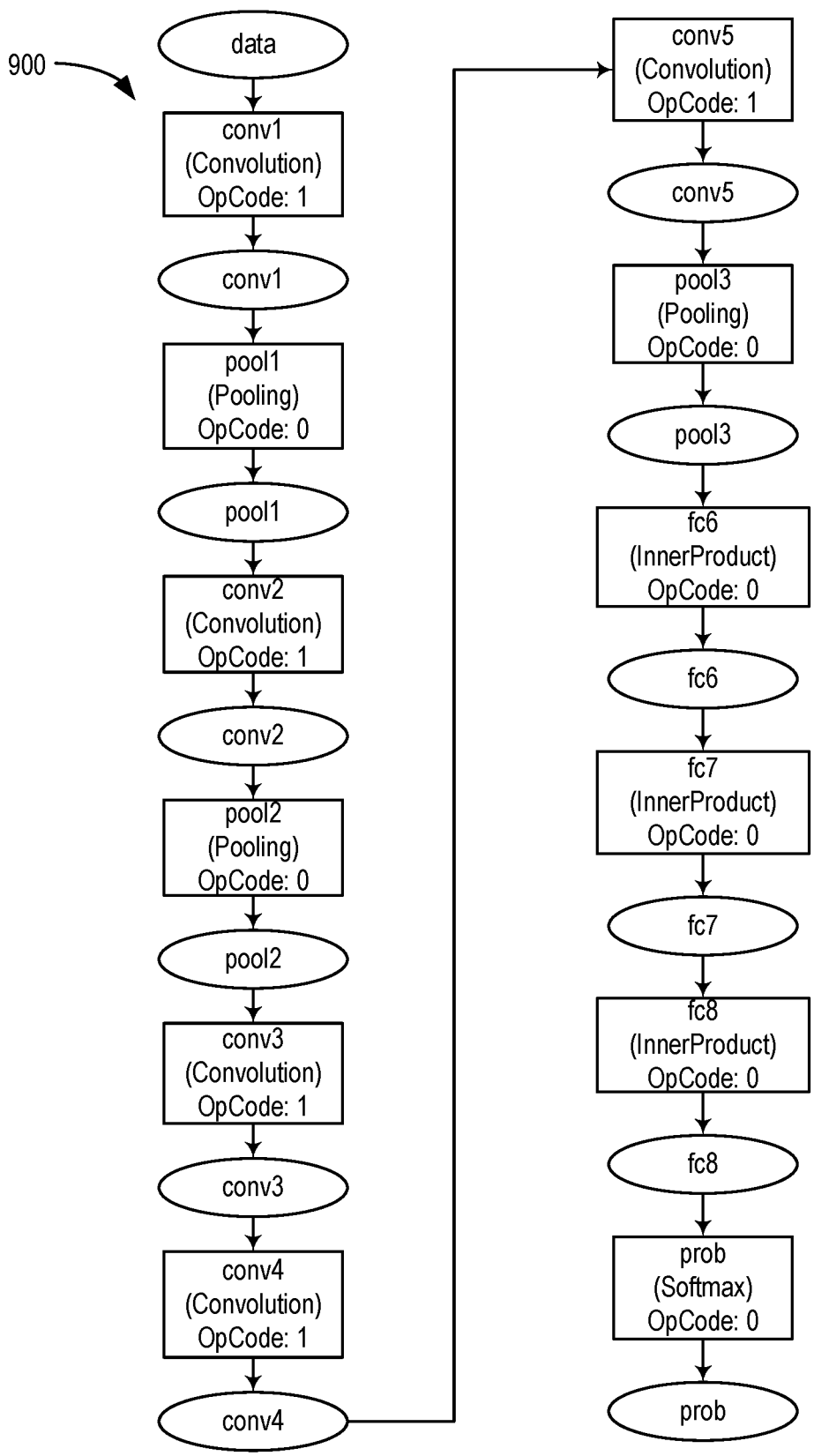

FIGS. 9A-B depict another example optimization of a network graph performed by the compiler 114 to generate the execution sequence vector, according to embodiments of the present disclosure. In one embodiment, FIGS. 9A and 9B illustrate an example layer fusion optimization. As compared to optimizations performed by the hardware independent optimizer 212, optimizations performed by the hardware dependent optimizer 214 on the network graph impact hardware and corresponding parameters of the programmable IC 120. With a layer fusion optimization, the backend 210 of the compiler 114, specifically the hardware dependent optimizer 214, fuses layers in the network graph 900 based on the supported functionality of the hardware. With one type of layer fusion optimization, the hardware dependent optimizer 214 fuses ReLU layers into the preceding layers if the preceding layer is a convolution layer, an ElementWise (sometimes shortened to "Eltwise") layer, a Fully-Connected layer, or a 3D-Separable convolution layer.

FIG. 9A illustrates a network graph for the hardware dependent optimizer 214 to optimize. Specifically, in one embodiment, the hardware dependent optimizer 214 identifies the ReLU layer nodes of the network graph, as illustrated by boxes $902_1$-$902_9$, having a preceding layer that is either a convolution layer, ElementWise layer, a Fully-Connected layer, or a 3D-Separable convolution layer. In one embodiment, the graphical representations of the buffers corresponding to the ReLU layers indicated by boxes $902_1$-$902_9$ have previously fused with the graphical representation of the buffer of the preceding layer.

FIG. 9B illustrates the network graph 800 after the ReLU layer fusion optimization, and in the graphical representation of FIG. 9B, all the ReLU layers have been fused leaving a single-path graph. After optimization of the network graph, the compiler 114 can proceed forward with generating the execution sequence vector, using example operations in FIG. 4C.

Figure 10A:
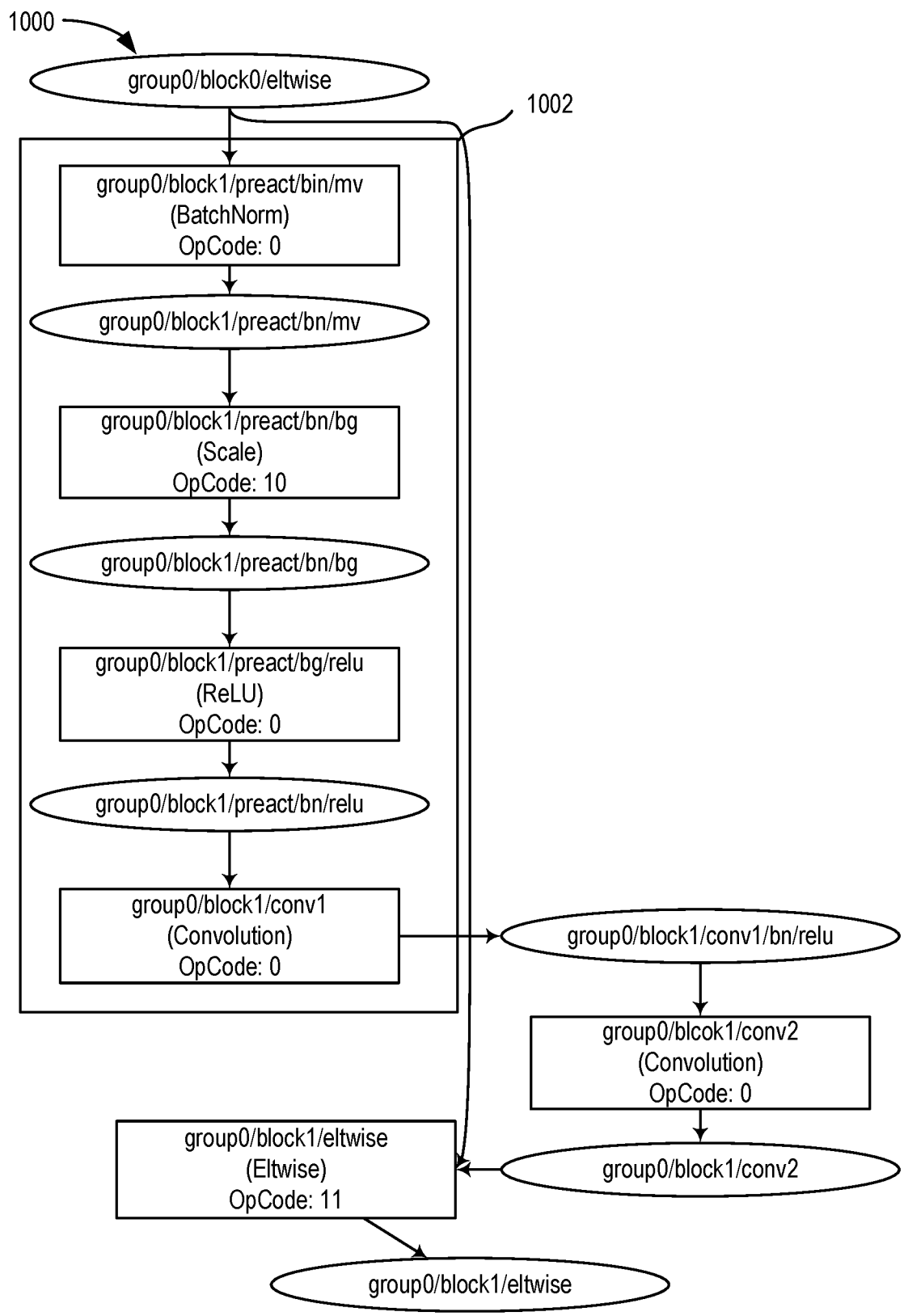
FIGS. 10A-B depict an example optimization of a network graph, according to embodiments of the present disclosure.
Figure 10B:
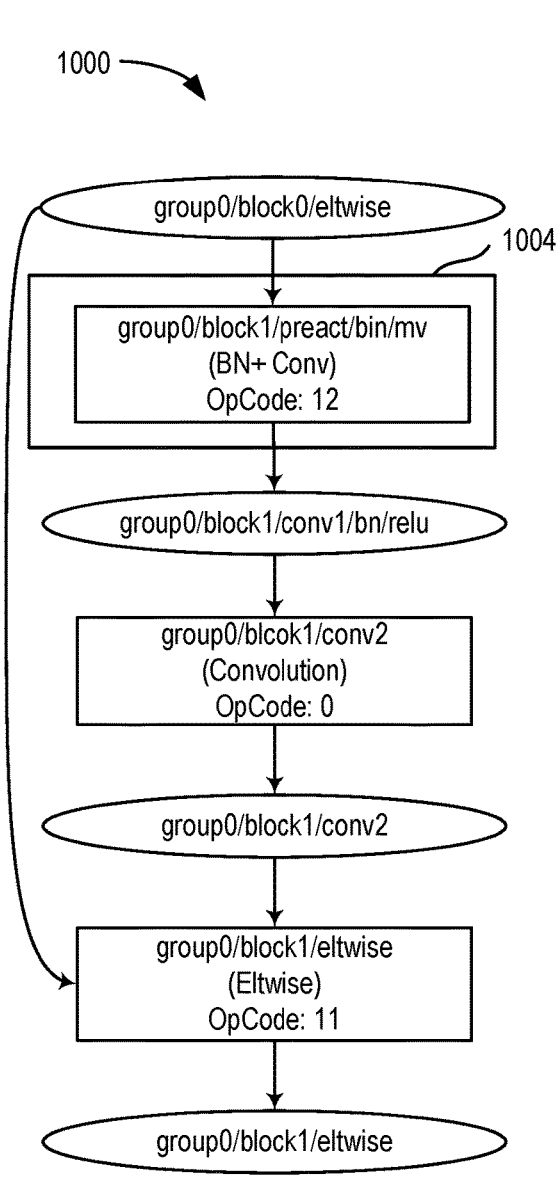

FIGS. 10A-B depict another example optimization of a network graph performed by the compiler 114 to generate the execution sequence vector, according to embodiments of the present disclosure. In one embodiment, FIGS. 10A and 10B illustrate an example layer fusion optimization. With one type of layer fusion optimization, the backend 210 of the compiler 114, specifically the hardware dependent optimizer 214, identifies and fuses batch-norm layer and scale layers into one operation. Additionally, in this layer fusion optimization, the hardware dependent optimizer 214 also fuses batch-norm layers, scale layers, and convolution layers into one operation if these layers appear in a particular order in the network graph. In some embodiments, the hardware dependent optimizer 214 fuses batch-norm layers, scale layers, and convolution layers into one operation if these layers appear in any order, combination or arrangement in the network graph. In other embodiments, the hardware dependent optimizer 214 requires a specific order of the batch-norm layers, scale layers, and convolution layers for layer optimization.

FIG. 10A illustrates a network graph 1000 for the hardware dependent optimizer 214 to optimize. Specifically, in one embodiment, the hardware dependent optimizer 214 identifies batch-norm layers, scale layers, and convolution layers for fusion, as illustrated in box 1002. Box 1002 identifies a batch-norm layer, a scale layer, a ReLU layer, and a convolution layer. In one embodiment, ReLU layers can include a passing ReLU flag, such that the optimizations can include ReLU layers when the flag indicates the optimizations can include the ReLU layer.

FIG. 10B illustrates the network graph after the batch-norm and scale layer fusion optimization, with box 1002 having a single layer node and the input going into the node of box 1004 being the same as the input going into the node of box 1002 prior to optimization and the output coming out of the node of box 1004 the same as the nodes of box 1004 prior to optimization. After optimization of the network graph, the compiler 114 can proceed forward with generating the execution sequence vector, using example operations in FIG. 4C.

Figure 11A:
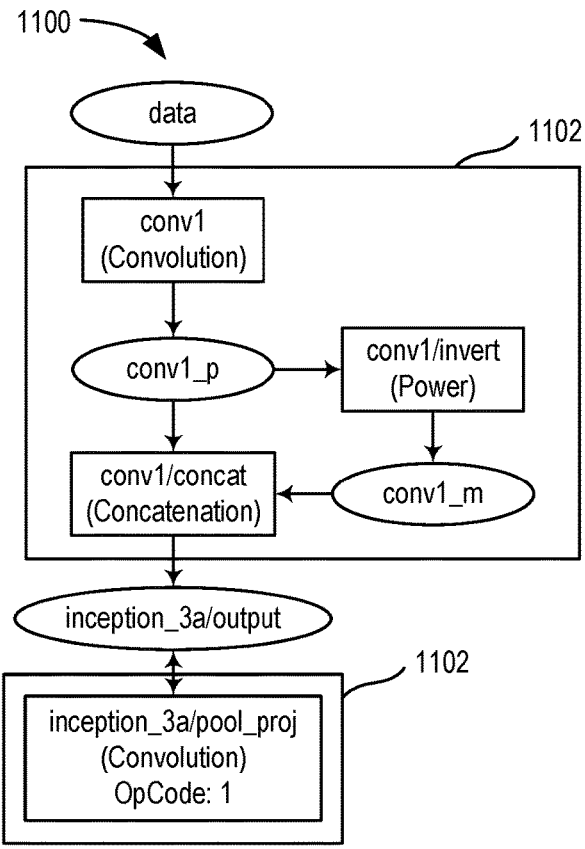
FIGS. 11A-B depict an example optimization of a network graph, according to embodiments of the present disclosure.
Figure 11B:
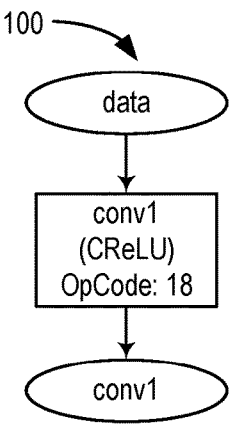

FIGS. 11A-B depict another example optimization of a network graph performed by the compiler 114 to generate the execution sequence vector, according to embodiments of the present disclosure. In one embodiment, FIGS. 11A and 11B illustrate an example layer fusion optimization. With one layer fusion optimization, the backend 210 of the compiler 114, specifically the hardware dependent optimizer 214, identifies and fuses convolution, concatenation, power, and ReLU layers into one operation (exported as CReLU layers) if they appear in a particular order. In one embodiment, the convolution, concatenation, power, and ReLU layers can appear in any order, combination, or arrangement for fusion by the hardware dependent optimizer 214.

FIG. 11A illustrates a network graph 1000 for the hardware dependent optimizer 214 to optimize. Specifically, in one embodiment, the hardware dependent optimizer 214 identified the convolution, concatenation, and power layers inside the boxes 1102 for optimization, and optimizes the network graph 1100 by fusing the layer nodes and buffer nodes of the network graph together.

FIG. 11B illustrates the network graph 1100 after the layer fusion optimization, having a single layer node, and the input going into the layer node being the same as the input going into the nodes of boxes 1102 prior to optimization and the output coming out of the layer node being the same as the output coming out of the nodes of boxes 1102 prior to optimization. After optimization of the network graph, the compiler 114 can proceed forward with generating the execution sequence vector, using example operations in FIG. 4C.

FIGS. 12A-B depict another example optimization of a network graph performed by the compiler 114 to generate the execution sequence vector, according to embodiments of the present disclosure. In one embodiment, FIGS. 12A and 12B illustrate an example layer fusion optimization. With one layer fusion optimization, the backend 210 of the compiler 114, specifically the hardware dependent optimizer 214, identifies and fuses 3D-separable convolution layers, ReLU layers, and convolution layers if they appear in a particular order. In another embodiment, the hardware dependent optimizer 214 fuses these layers if they appear in the network graph in any order, combination, or arrangement.

FIG. 12A illustrates a network graph 1200 for the hardware independent optimizer 212 to optimize. Specifically, in one embodiment, the hardware dependent optimizer 214 identified a first convolution layer, a first ReLU layer, a second convolution layer, and a second ReLU layer inside the box 1202 for optimization, and optimizes the network graph 1200 by fusing these layer nodes and corresponding buffer nodes of the network graph together.

FIG. 12B illustrates the network graph 1200 after one layer fusion optimization, with box 1204 having a single 3DS-Conv+Conv layer node, and the input going into the optimized node of box 1204 being the same as the input going into the nodes of box 1202 prior to optimization, and the output coming out of the optimized node of box 1204 being the same as the output coming out of the nodes of box 1202 prior to optimization. After optimization of the network graph, the compiler 114 can proceed forward with generating the execution sequence vector, using example operations in FIG. 4C.

FIG. 13 depicts an example assignment of sequence identifiers to layers of a network graph performed by the compiler 114 to generate the execution sequence vector after optimizing the network graph, according to embodiments of the present disclosure. After the network graph passes through the hardware independent optimizer 212 and the hardware dependent optimizer 214, the network graph goes to the job queue scheduler 216 of the backend 210 of the compiler 114 and the job queue scheduler 216 generates the execution sequence vector. FIG. 13 illustrates the corresponding execution sequence vector generation based on an network graph by the job queue scheduler 216 of the backend 210, and illustrates the sequence identifier ("Seq ID") assigned to each layer of the network graph 1300

In one embodiment, the job queue scheduler 216 applies a breadth-first search (BFS) approach to assign a sequence identifier to each layer node in the network graph. The sequence identifier defines the sequence in which the layers in the network graph execute. For each layer passing through the job queue scheduler 216, the backend 210 loads the sequence identifiers of the preceding and succeeding layers. Accordingly, the execution sequence vector comprises information about each layer node, including where the layer node appears in the vector, the layer type, the preceding layer node (the parent layer node), and the succeeding layer nodes (the child layer nodes). Table 2 includes example information in an execution sequence vector based on the network graph of FIG. 13.

TABLE 2

| SeqID | Layer Type | Prev SeqID | Next SeqID |
|---|---|---|---|
| 1 | Pooling | NA | 2, 3, 4, 5 |
| 2 | Convolution | 1 | 9 |
| 3 | Convolution | 1 | 6 |
| 4 | Convolution | 1 | 7 |
| 5 | Pooling | 1 | 8 |
| 6 | Convolution | 3 | 9 |
| 7 | Convolution | 4 | 9 |
| 8 | Convolution | 5 | 9 |
| 9 | Pooling | 2, 6, 7, 8 | NA |

Figure 14A:
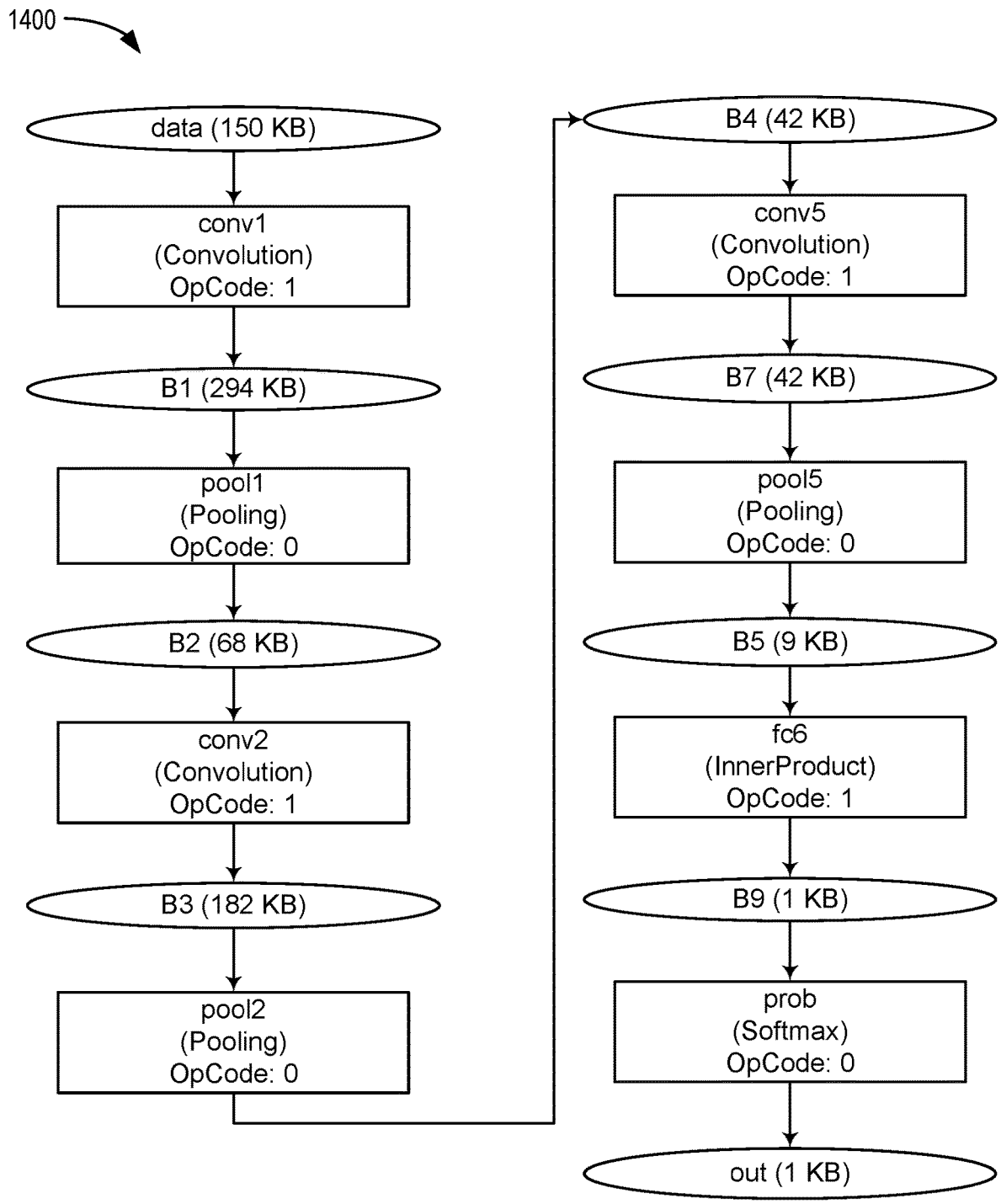
FIGS. 14A-B depict an example optimization of buffers of a DNN, according to embodiments of the present disclosure.
Figure 14B:
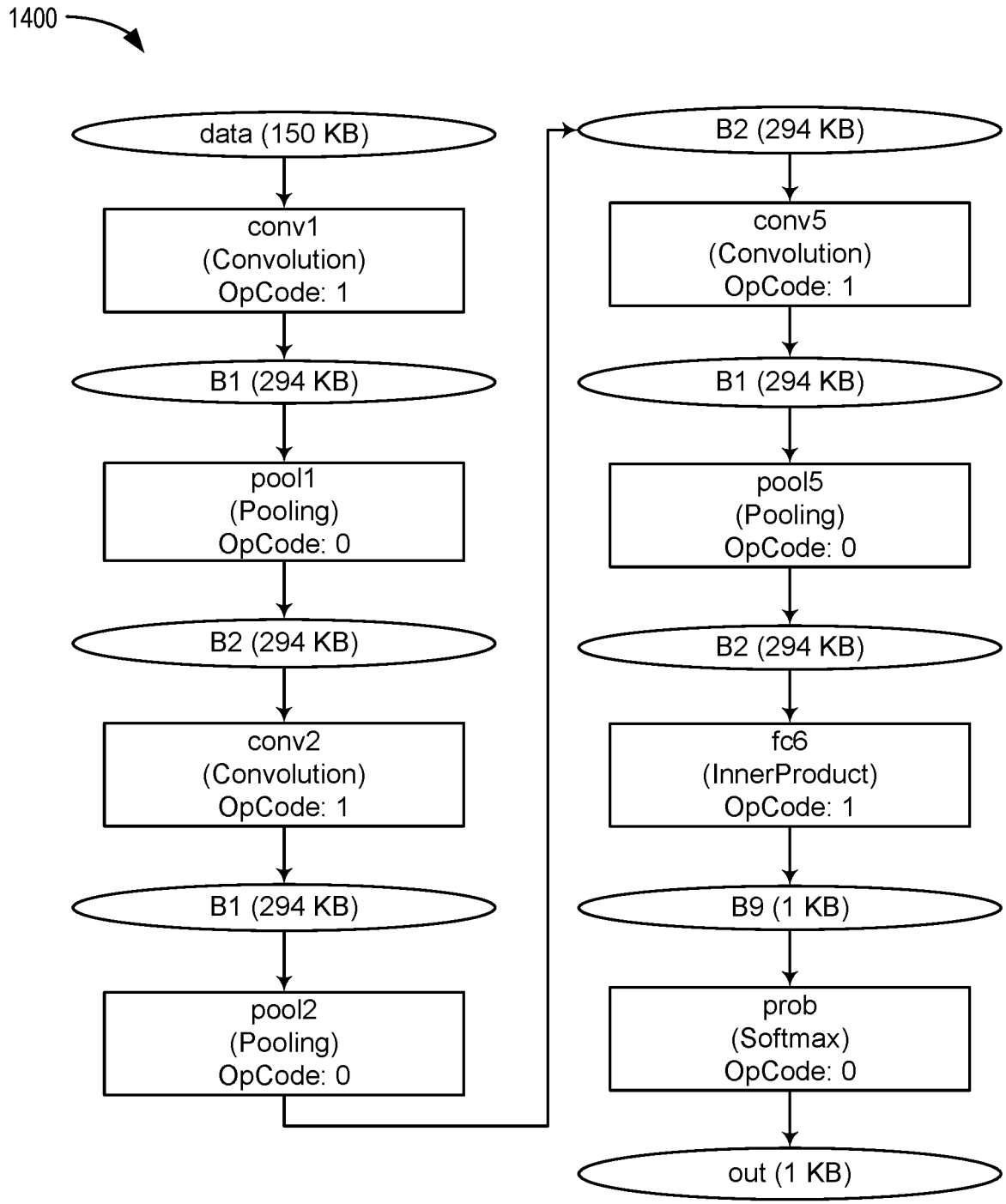

FIGS. 14A-B depict an example optimization of buffers of a neural network performed by the compiler 114 after generating the execution sequence vector so that the compiler can load optimized buffer information into the execution sequence vector, according to embodiments of the present disclosure. In one embodiment, the backend 210 of the compiler 114 further comprises a IO memory optimizer 218, and this IO memory optimizer 218 allocates a set of buffer handles along with the sizes, which can be used for storing I/O (also referred herein as activations) between layers while reusing the buffers between layers of the network graph. In one embodiment, a buffer handle is a string notation to represent input and output buffers of each layer and indicates blocks of memory dedicated to corresponding buffers. The backend 210 loads the buffer handles and corresponding sizes onto the execution sequence vector from the job queue scheduler 216. In one embodiment, the backend 210 may make design choices such as: (1) the backend 210 can initialize the buffer sizes of all the buffer handles to the size of the largest buffer for IO activations, and can attach all the buffer handles to the same size; and (2) the backend 210 cannot reuse buffer handles attached to layers optimized for software execution (e.g., layers that are not hardware-accelerated).

In one network graph of FIGS. 14A and 14B, the IO memory optimizer 218 has optimized the buffers from the network graph 1400 illustrated in FIG. 14A to the buffers of the work graph illustrated in FIG. 14B. As illustrated, the network graph 1400 of FIG. 14A has 9 different buffers between the layer nodes, and the network graph of FIG. 14B has 3 different buffers between the layer nodes, which reduces the number of buffers between the layer nodes. In one embodiment, the IO memory optimizer 218 optimized buffer node B3, buffer node B4, buffer node B7, and buffer B5 by enlarging the buffer size of buffer B2, and replaced buffer node B3, buffer node B4, buffer node B7, and buffer B5 with multiple instances of buffer B2.

Figure 15:
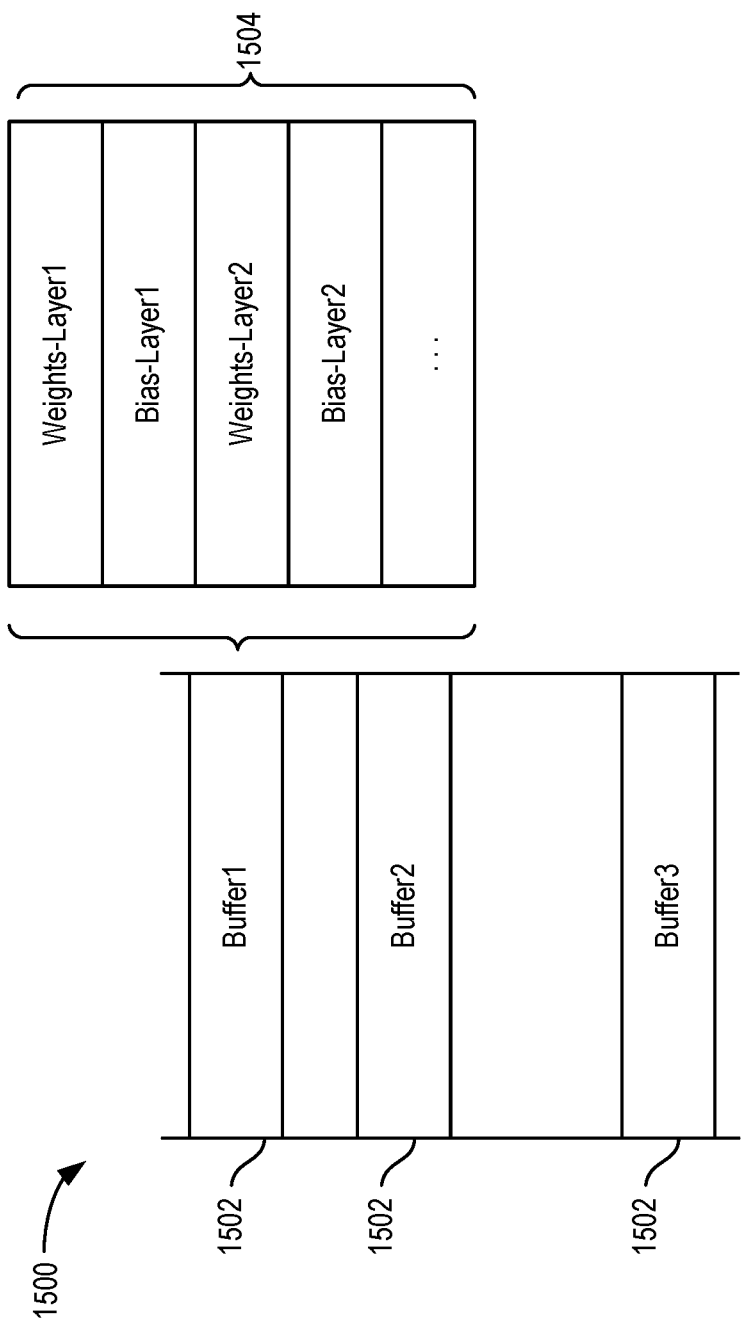
FIG. 15 illustrates buffer memory management, according to embodiments of the present disclosure.

FIG. 15 illustrates buffer memory management 1500 of the programmable IC 120 after the HAL 116 receives the execution sequence vector with buffer nodes optimized as illustrated in FIG. 14A-B and when the HAL 116 begins setup of the hardware runtime parameters of the programmable IC 120, according to embodiments of the present disclosure. As mentioned previously, the HAL 116 receives an execution sequence vector from the compiler 114, and the execution sequence vector passes to the programmable IC setup component 222, the buffer manager 224, and to the command scheduler 226. Of the components of the HAL 116, the buffer manager 224 handles both constant buffers and I/O buffers used for both hardware and software of the programmable IC 120. The buffer manager 224 allocates two kinds of buffers: constant buffers and I/O buffers. The constant buffers are read-only buffers for the programmable IC 120 and are used for trained parameters (e.g., weights for layers in the neural network to process input data). The I/O buffers are read-write buffers for the programmable IC 120 to store the intermediate outputs between layers/nodes and accordingly can be reused between layers/nodes of the neural network. The following discussion further describes the differences between constant buffers and the I/O buffers, especially as to the data organization of each type of buffer.

For the constant buffers, each layer of the network graph has its own set of constants data (e.g., weights, biases) and the buffer manager 224 loads the constant data into the constant buffers before invoking the programmable IC for inference. The buffer manager 224 allocates a pool of constant buffers and generates the layer offsets into these constant buffers. The hardware-setup block, described in further detail below, uses these layer offsets to populate the constant buffers with the constants data. The buffer manager 224 pre-allocates a pool of fixed-size buffers (e.g., 64 MB) based on the memory footprint of the constants (e.g., parameters, biases) used by the network. Each buffer is a contiguous block of memory and can host constants of multiple layers, but the constant buffers do not permit the constants data to straddle across multiple buffers.

In one embodiment of FIG. 15, the buffer manager 224 allocates constant buffers 1502 of equal sizes in memory (such as DDR memory). Each of the constant buffers 1502 can host the constants data 1504 for one or more layers/nodes in the network as illustrated by the constants data 1504. In the example of FIG. 15, Buffer 1 1502 hosts constants data 1504 comprising weights data for a Layer 1, bias data for Layer 1, weights data for Layer 2, and bias data for Layer 2.

Figure 16:
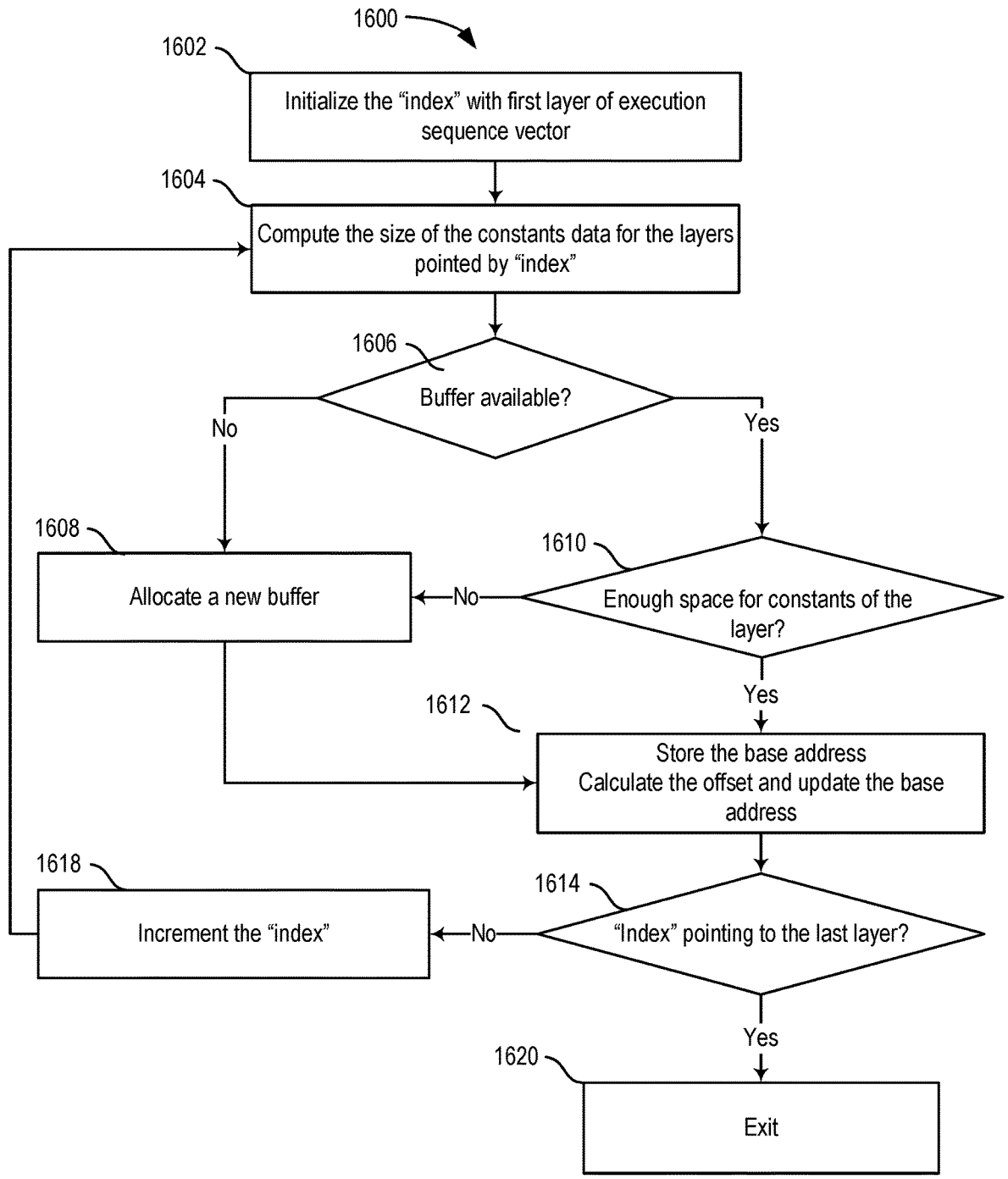
FIG. 16 is a flow chart of DNN buffer allocation, according to embodiments of the present disclosure.

FIG. 16 is a flow chart of neural network buffer allocation performed by the HAL 116 when the HAL receives the execution sequence vector so the HAL 116 can allocate buffers as illustrated in FIG. 15, according to embodiments of the present disclosure. Specifically, one flowchart describes the buffer allocation routine for constant buffers. The buffer allocation routine 1600 begins at block 1602 by initializing the "index" with the first layer of the execution sequence vector. In one embodiment, the "index" is a pointer indicating a particular layer of the execution sequence vector. At 1602, the "index" points at the first layer of the execution sequence vector.

At 1604, the buffer allocation routine continues by computing the size of the constants data for the layers pointed by the "index."

At 1606, the buffer allocation routine 1600 continues by determining whether there is an available buffer available.

If there is no buffer available, then at 1608, the buffer allocation routine 1600 continues by allocating a new buffer.

If there is an available buffer, then at 1610, the buffer allocation routine 1600 continues by determining whether there is enough space for the constants data of the layer.

If there is not enough space for the constants data of the layer, then at 1608, the buffer allocation routine 1600 continues by allocating a new buffer.

After block 1608 or if there is enough space for the constants data of the layer, then at 1612, the buffer allocation routine 1600 continues by storing the base address, calculating the offset, and updating the base address.

At block 1614, the buffer allocation routine 1600 continues by determining whether the "index" is pointing to the last layer of the network.

If the "index" is not pointing at the last layer of the network, at 1616, the buffer allocation routine 1600 continues by incrementing the "index" and returns to block 1604 to repeat the previous blocks for the layer indicated by the newly incremented "index."

If the "index" is pointing at the last layer of the network, then at 1620, the buffer allocation routine 1600 ends.

Figure 17:
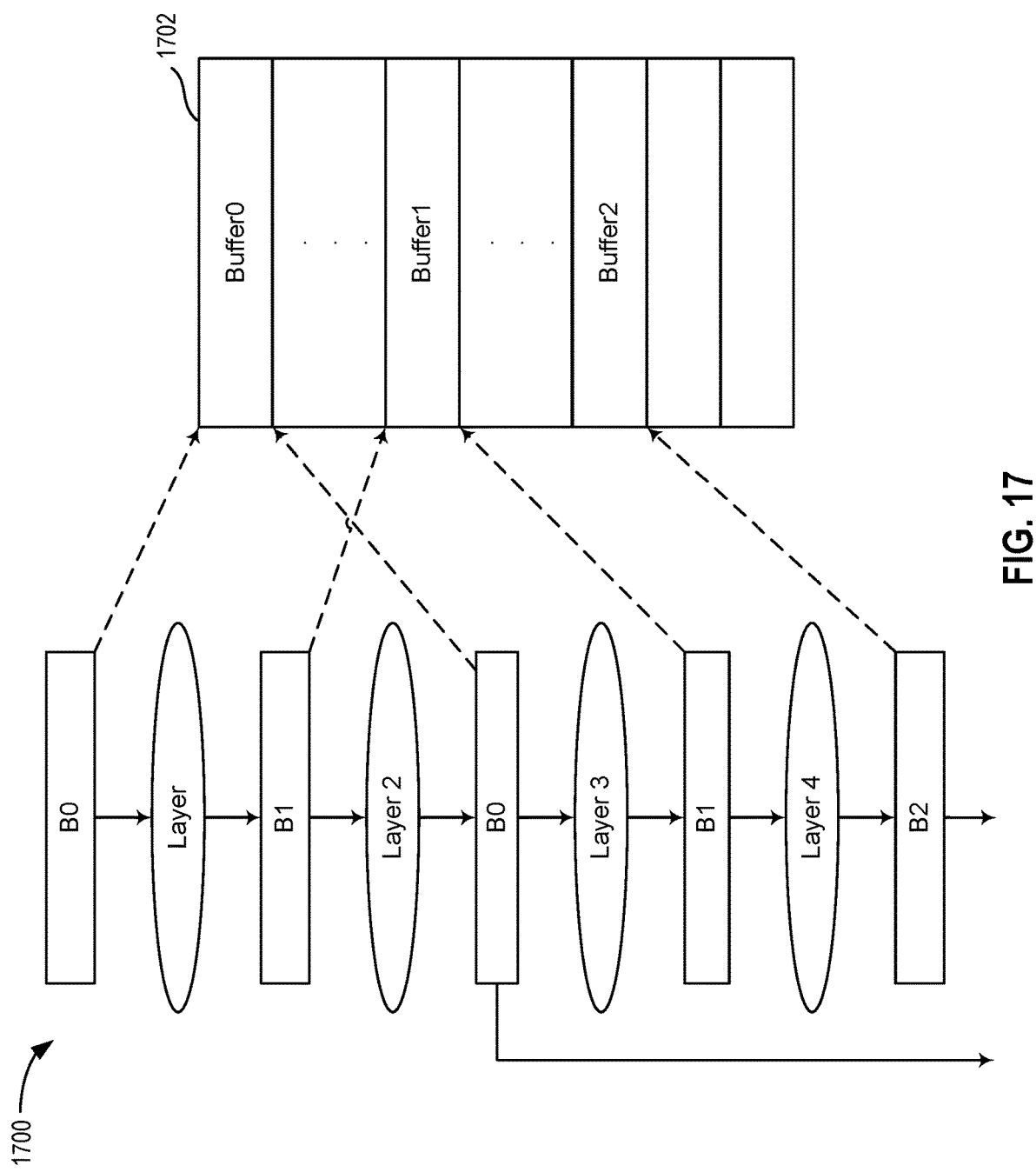
FIG. 17 depicts the interaction between the layers, buffers, and buffer management of a DNN, according to embodiments of the present disclosure.

FIG. 17 depicts the interaction between the layers, buffers, and buffer management of a neural network after the HAL 116 has performed a buffer allocation routine, such as the buffer allocation routine 1600 illustrated in FIG. 16, on the programmable IC 120, according to embodiments of the present disclosure. As mentioned previously, the buffer manager 224 handles both constant buffers and I/O buffers used for both hardware and software of the programmable IC 120. In one embodiment, the backend 210 of the compiler 114 allocates a set of buffer handles, along with the size of the buffer, which can be used for storing the I/O (activations) between layers while reusing the buffers between layers. In one embodiment, the buffer handle is a string notation to represent input and output buffers of each layer and indicates blocks of memory dedicated to corresponding buffers. The buffer manager 224 allocates a continuous block of memory for each unique buffer handle, and maintains a dictionary of buffer handles and the corresponding pointers to the contiguous block of memory. The buffer manager 224 parses through the execution sequence vector, and for each layer, checks the input and output handle occurrence in the dictionary. If the dictionary returns a miss on the check, the buffer manager 224 allocates a contiguous block of memory for the handle and registers the address of the block allocated along the handle with the dictionary.

In one embodiment, the graph 1700 comprises buffer nodes and layer nodes. The buffer nodes of the graph 1700 have been optimized for more efficient memory allocation. As illustrated, the buffer nodes of the graph correspond to only three buffer handles in the memory block 1702. The memory block 1702 maintains the dictionary of buffer handles and corresponding pointers for the buffer nodes of the graph 1700.

Figure 18:
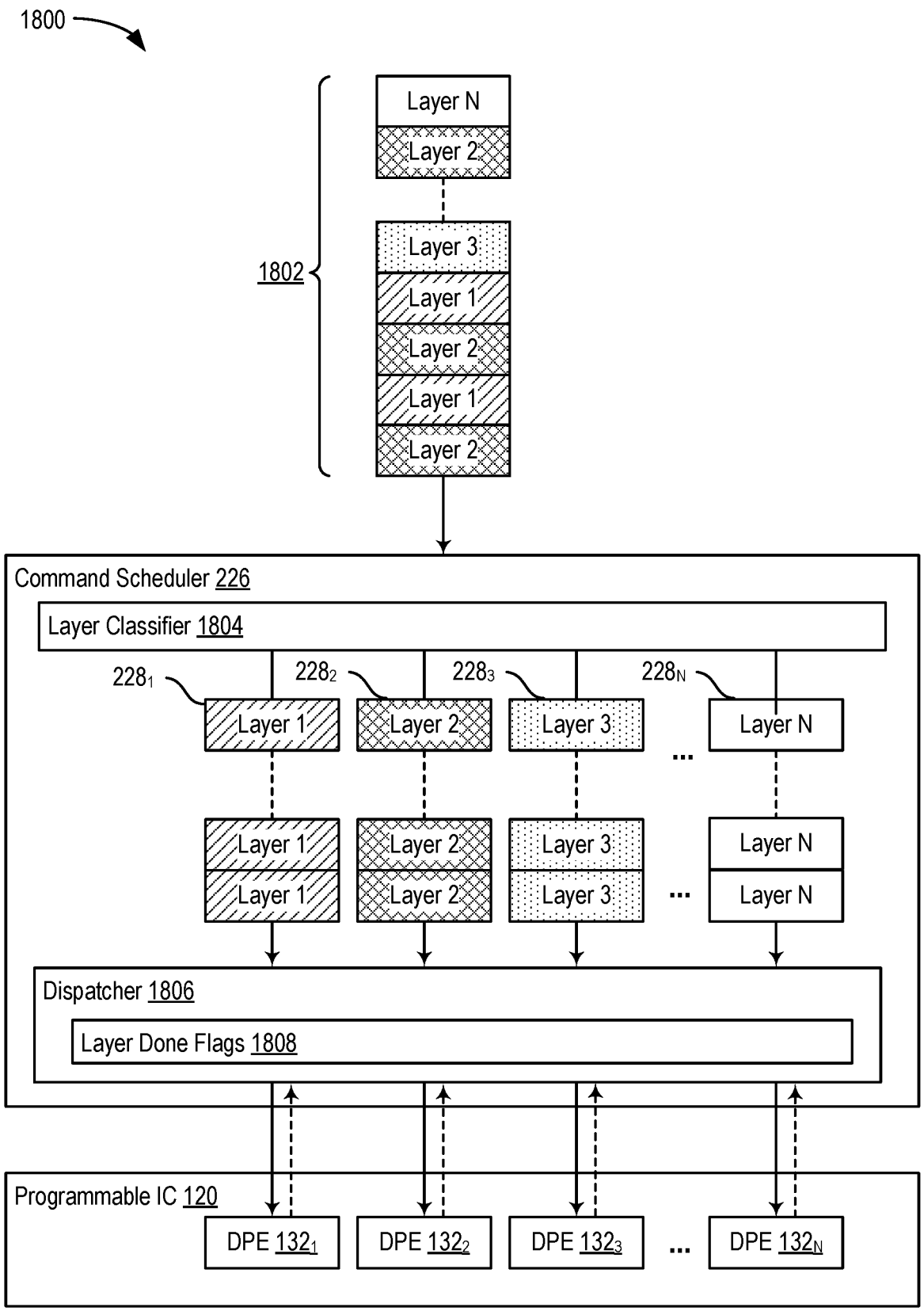
FIG. 18 is a block diagram of the command scheduler and the programmable IC, according to embodiments of the present disclosure.

FIG. 18 is a block diagram 1800 of the command scheduler 226 taking in the execution sequence vector 1802 to execute on the programmable IC 120 after the HAL 116 has completed buffer allocation (FIG. 16) and the network graph represented by the execution sequence vector resembles the network graph in FIG. 17, according to embodiments of the present disclosure. As mentioned, the command scheduler 226 efficiently dispatch commands, via the dispatcher 1806 in the execution sequence vector 1802 to the programmable IC 120 for processing.

In one embodiment, the command scheduler 226 takes in an execution sequence vector 1802. The execution sequence vector 1802 comprises many instances of different layer types, and the layer instances appear in any combination and order in the execution sequence vector 1802. The command scheduler 226 receives the execution sequence vector 1802 and passes it through a layer classifier 1804. The command scheduler 226 uses the layer classifier 1804 to segregate the commands in the execution sequence vector 1802 based on the DPE to be used for processing the command. In some embodiments, the command scheduler 226 maintains a separate command queue $228_1$-$228_N$ for each DPE $132_1$-$132_N$ of the programmable IC 120. Once the commands of the execution sequence vector 1802 are separated based on layer type, the dispatcher 1806 then pops commands from the queues, checks for any dependencies on the command, and if the dependencies are cleared for a command, the scheduler dispatches the command to the respective DPEs $132_1$-$132_N$ asynchronously and receives a corresponding response from the respective DPE upon completion of the command. Because each DPE has its own command queue $228_1$-$228_N$ for dispatch, multiple DPEs can be active simultaneously.

In some embodiments, the dispatcher 1806 comprises layer done flags 1808, which indicates to the dispatcher that the programmable IC 120 has completed the commands/operations corresponding to the layer transmitted to the programmable IC 120 asynchronously.

Figure 19:
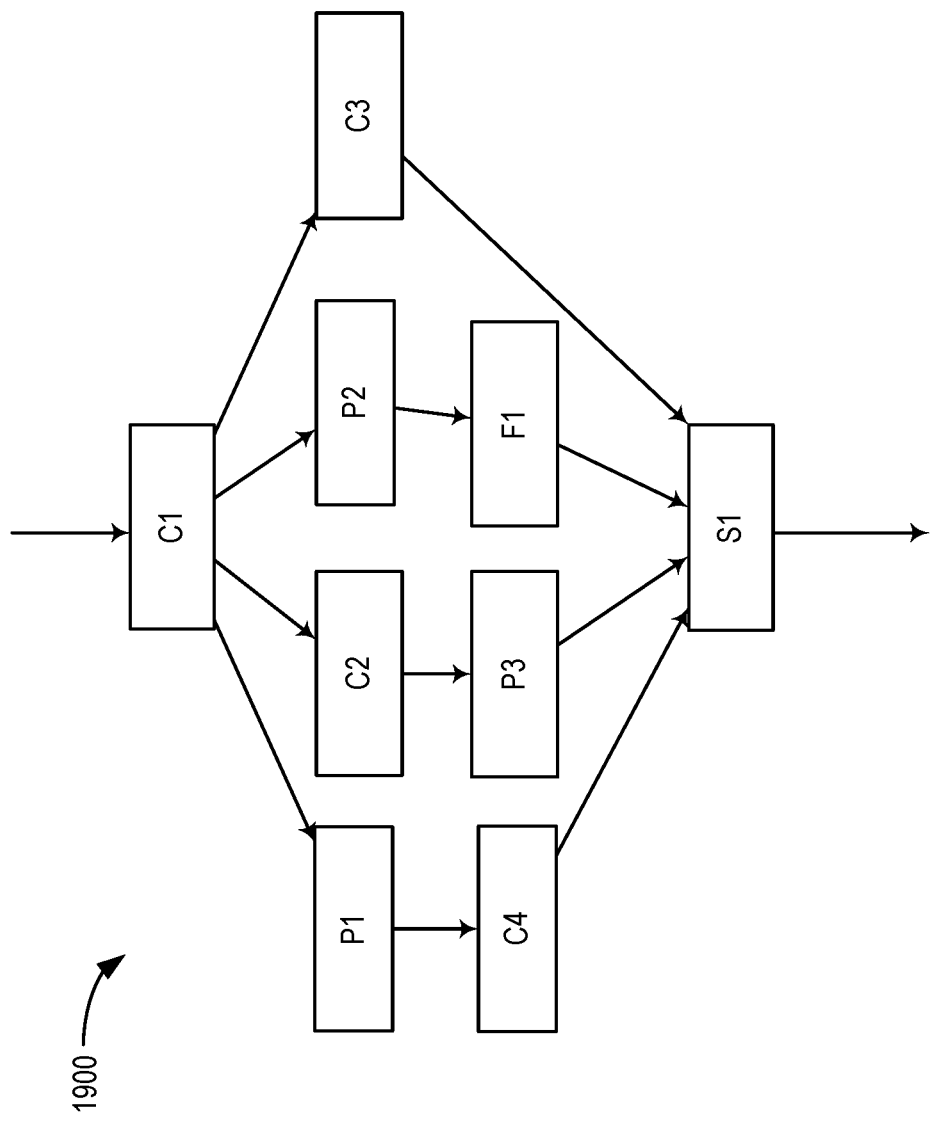
FIG. 19 is an example graphical representation of a scheduling sequence for a DNN, according to embodiments of the present disclosure.

FIG. 19 is an example graphical representation of a scheduling sequence for a neural network based on layer types to be passed through a command scheduler 226 for execution on a programmable IC 120, according to embodiments of the present disclosure. For example, the compiler 114 generates the execution sequence vector based on the network graph 1900, and the HAL 116 processes the execution sequence vector as illustrated in FIG. 18. Accordingly, FIG. 19 illustrates the topology of an example network to be passed through the compiler 114 and HAL 116. As illustrated in previous network graphs, a neural network can have multiple layer types, and each layer type can have multiple instances in a neural network. For example, in one embodiment, layers C1, C2, C3, and C4 comprise Layer Type 1; layers P1, P2, and P3 comprise Layer Type 2, layer F1 comprises Layer Type 3; and layer 51 comprises Layer Type N. The connections between the layers of a network also influence the scheduling sequence of layers, as illustrated in FIG. 20.

Figure 20:
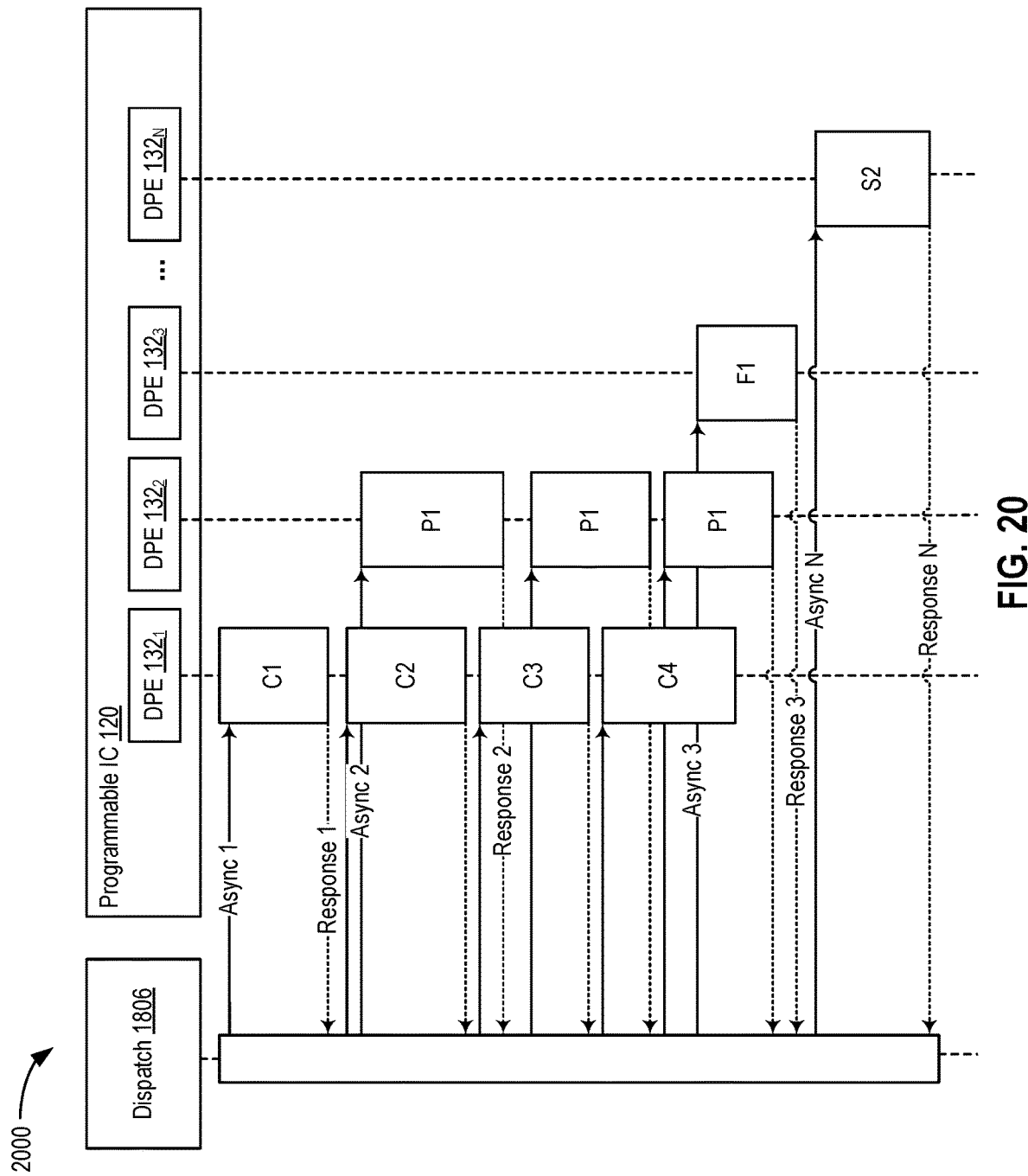
FIG. 20 is a sequence diagram for a DNN, according to embodiments of the present disclosure.

FIG. 20 is a sequence diagram for a neural network passing through the HAL 116, which transmits commands to the programmable IC 120 to perform actions based on the neural network, according to embodiments of the present disclosure. For example, FIG. 20 uses the network graph 1900 of FIG. 19 for illustration of commands from the dispatcher 1806 of the HAL 116 to the DPEs $132_1$-$132_N$ of the programmable IC 120. In one embodiment, the sequence diagram follows the topology of the example network of FIG. 19 in accordance with the structure of the command scheduler 226 and the programmable IC 120. Each layer type (Layer Type 1, Layer Type 2, Layer Type 3, Layer Type N) corresponds to a DPE of the programmable IC 120. The dispatcher 1806 makes asynchronous transmissions to each of the DPEs $132_1$-$132_N$, and the asynchronous transmissions from the dispatcher 1806 comprises of the commands corresponding to each layer based on the layer's type. For example, DPE $132_1$ processes commands corresponding to layers of Layer Type 1, such as C1, C2, C3, and C4 (illustrated in both FIGS. 19 and 20).

In one embodiment, the DPEs receive a new asynchronous command transmission for a new layer of a certain type after the DPE has sent back a response back to the dispatcher, informing the dispatcher 1806 that the DPE has completed the command corresponding to the layer. For example, the asynchronous command transmission for C2 does not occur until the DPE $132_1$ has responded with Response 1 for C1. The dispatcher 1806 continues to send asynchronous command transmissions and receive response from each DPE for each layer in the neural network. In some embodiments, because each DPE has its own command queue $228_1$-$228_N$ for dispatch, asynchronous command transmissions (such as Async 1, Async 2, Async 3, and Async 4) can occur in succession despite not receiving a Response from another DPE. For example, the dispatcher 1806 transmits an asynchronous command transmission to DPE $132_1$ to perform the operation of Layer C2, and before DPE $132_1$ sends a response transmission back to the dispatcher 1806 (e.g., Response 1), the dispatcher 1806 sends another asynchronous command transmission (Async 2) to DPE 1322 to perform the operation of Layer P1.

Figure 21:
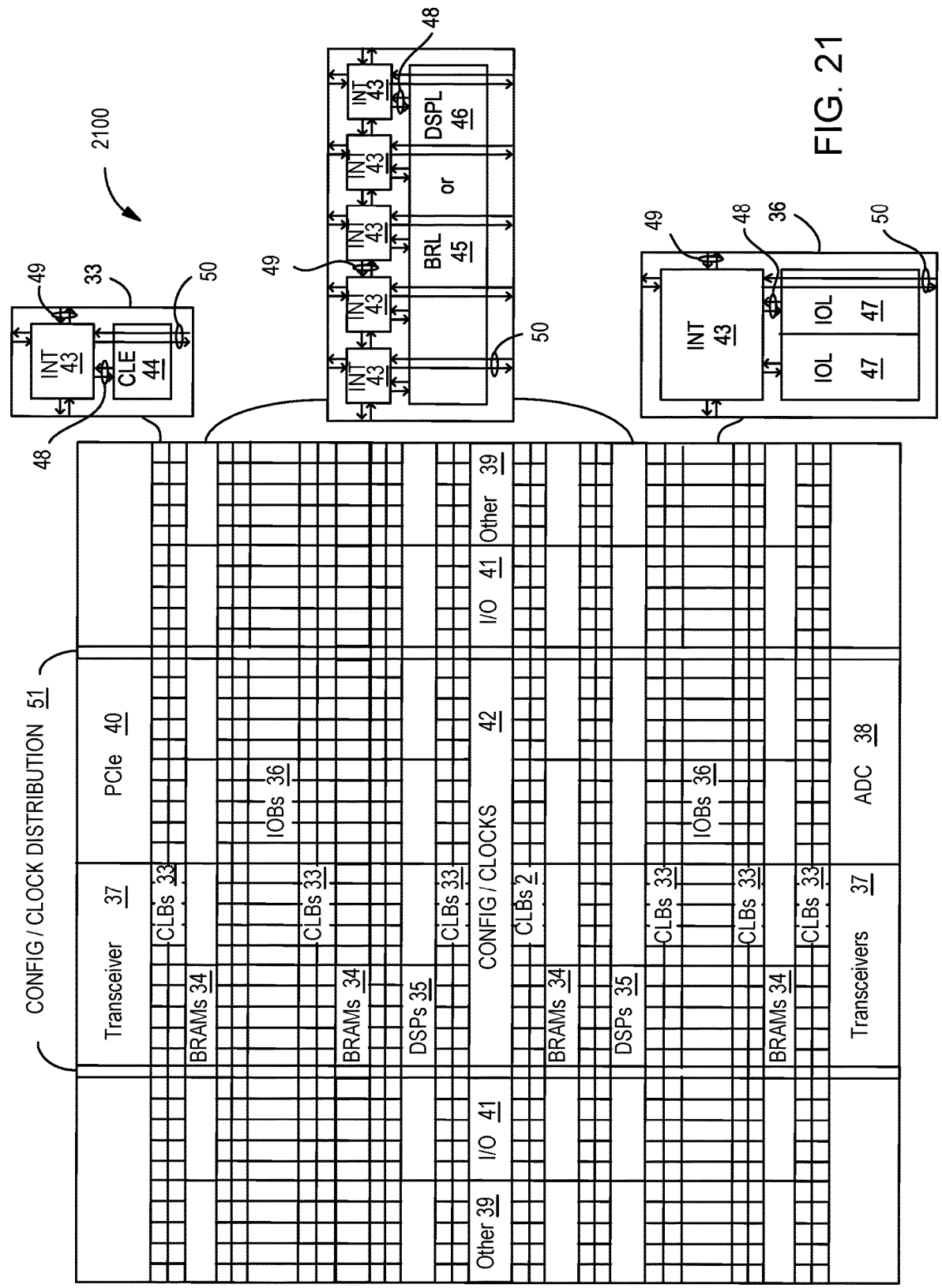
FIG. 21 illustrates a field programmable gate array implementation of a programmable IC according to an example embodiment.

FIG. 21 illustrates a field programmable gate array implementation of a programmable IC according to an example. In one embodiment, the programmable IC is an FPGA. FIG. 21 illustrates an FPGA 2100 implementation of the IC 120 that includes a large number of different programmable tiles including transceivers 37, CLBs 33, BRAMs 34, input/output blocks ("IOBs") 36, configuration and clocking logic ("CONFIG/CLOCKS") 42, DSP blocks 35, specialized input/output blocks ("I/O") 41 (e.g., configuration ports and clock ports), and other programmable logic 39 such as digital clock managers, analog-to-digital converters, system monitoring logic, and so forth. The FPGA can also include PCI interfaces 40, analog-to-digital converters (ADC) 38, and the like.

In some FPGAs, each programmable tile can include at least one programmable interconnect element ("INT") 43 having connections to input and output terminals 48 of a programmable logic element within the same tile, as shown by examples included at the top of FIG. 21. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. In one embodiment, the BRAM 34 is one of the memory blocks of memory 140 which can retain stored data during reconfigurations as described above. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 21) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 21 include additional logic blocks that disrupt the regular columnar structure making up a large part of the FPGA. The additional logic blocks can be programmable blocks and/or dedicated logic.

Note that FIG. 21 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 21 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational blocks to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A method for mapping and porting a neural network to an integrated circuit (IC), the method comprising:
   receiving a framework dependent network description of the neural network;
   generating a framework independent and hardware agnostic network graph based on the framework dependent network description and a type of a framework in which the network description was generated;
   performing a plurality of back-end operations on the framework independent and hardware agnostic network graph to generate an execution sequence vector; and
   configuring the IC based on the execution sequence vector.

2. The method of claim 1, wherein performing the plurality of back-end operations comprises performing at least one hardware-independent optimization.

3. The method of claim 2, wherein performing the at least one hardware-independent optimization comprises performing one of the following: parallel 1×1 convolutions fuse optimizations, software fuse optimizations, dropout optimizations, reshape optimizations, flatten optimizations, concatenation layer optimizations, custom layer optimizations, prior box optimizations, and training layer removal optimizations.

4. The method of claim 1, wherein performing the plurality of back-end operations comprises performing at least one hardware-dependent optimization.

5. The method of claim 4, wherein performing the at least one hardware-dependent optimization comprises performing one of the following: convolution and Rectified Linear Unit (ReLU) optimizations, hardware fusion optimization, Concatenated ReLu (CReLU) optimizations, ElementWise Addition optimizations, ReLU optimizations, 3D separable convolution optimizations, and deconvolution optimizations.

6. The method of claim 1, wherein the plurality of back-end operations comprises:
   refining the framework independent and hardware agnostic network graph into a hardware-dependent network graph via hardware-independent optimizations and hardware-dependent optimizations;
   assigning sequence identifiers to each layer of the hardware-dependent network graph; and
   generating the execution sequence vector comprising a sequential queue of the layers of the hardware-dependent network graph.

7. The method of claim 6, wherein generating the execution sequence vector comprises optimizing buffer handles for reuse between layers of the hardware-dependent network graph.

8. The method of claim 1, wherein generating the framework independent and hardware agnostic network graph comprises generating layer nodes corresponding to layers of the neural network and buffer nodes between the layer nodes.

9. The method of claim 1, wherein the plurality of back-end operations comprises allocating buffer handles for a plurality of layers of the framework independent and hardware agnostic network graph.

10. The method of claim 1, wherein configuring the IC comprises calibrating a plurality of hardware runtime parameters of the IC based on the execution sequence vector.

11. The method of claim 10, wherein calibrating the plurality of hardware runtime parameters of the IC based on the execution sequence vector comprises computing scalar parameters to program the IC.

12. The method of claim 1, wherein configuring the IC comprises scheduling the plurality of commands of the execution sequence vector for a plurality of processing elements of the IC.

13. The method of claim 12, wherein scheduling the plurality of commands of the execution sequence vector for the plurality of processing elements of the IC comprises dispatching the plurality of commands to DPEs of the IC for processing.

14. The method of claim 12, wherein scheduling the plurality of commands comprises:
   separating the plurality of commands into a plurality of command queues based on a processing element of the plurality of processing elements used to process a command;
   determining whether the command has dependencies; and
   asynchronously dispatching the command to the processing element for processing.

15. The method of claim 12, wherein scheduling the plurality of commands further comprises:
   receiving a command completion response from a processing element of the plurality of processing elements; and
   asynchronously dispatching a next command to the processing element.

16. The method of claim 1, further comprising allocating a plurality of software and hardware buffers based on the execution sequence vector by configuring the plurality of software and hardware buffers based on a plurality of commands of the execution sequence vector.

17. A system comprising:
   a processor; and
   non-transitory computer-readable storage medium embodying computer program instructions for mapping and porting a neural network to an integrated circuit (IC), the computer program instructions implementing a method, the method comprising:
   receiving a network description of the neural network;
   generating a framework independent and hardware agnostic network graph based on the network description and a type of a framework in which the network description was generated;
   performing a plurality of back-end operations on the framework independent and hardware agnostic network graph to generate an execution sequence vector; and
   configuring the IC based on the execution sequence vector.

18. The system of claim 17, wherein configuring the IC comprises scheduling the plurality of commands of the execution sequence vector for a plurality of components of the IC by dispatching the plurality of commands to DPEs of the IC for processing.

19. The system of claim 17, wherein configuring the IC comprises:
   scheduling the plurality of commands of the execution sequence vector for a plurality of components of the IC by separating the plurality of commands into a plurality of command queues based on a processing element used to process a command;
   determining whether the command has dependencies; and
   asynchronously dispatching the command to the processing element for processing.

20. The system of claim 17, wherein the plurality of back-end operations comprises:
   refining the framework independent and hardware agnostic network graph into a hardware-dependent network graph via hardware-independent optimizations and hardware-dependent optimizations;
   assigning sequence identifiers to each layer of the hardware-dependent network graph; and
   generating the execution sequence vector comprising a sequential queue of the layers of the hardware-dependent network graph.

\* \* \* \* \*

UNITED STATES PATENT AND TRADEMARK OFFICE
CERTIFICATE OF CORRECTION

PATENT NO. : 10,789,402 B1
APPLICATION NO. : 16/400690
DATED : September 29, 2020
INVENTOR(S) : Vemuri et al.

Page 1 of 1

It is certified that error appears in the above-identified patent and that said Letters Patent is hereby corrected as shown below:

In the Specification

Column 18, Line 40, Delete "51" and insert -- S1 --, therefor.

In the Claims

Column 22, Line 67, In Claim 5, delete "ReLu" and insert -- ReLU --, therefor.

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*